United States Patent
Tanaka et al.

(10) Patent No.: US 11,309,194 B2
(45) Date of Patent: Apr. 19, 2022

(54) SUBSTRATE LIQUID TREATMENT APPARATUS

(71) Applicant: Tokyo Electron Limited, Tokyo (JP)

(72) Inventors: Koji Tanaka, Koshi (JP); Toshiyuki Shiokawa, Koshi (JP); Koji Yamashita, Koshi (JP); Hiroyuki Masutomi, Koshi (JP); Hitoshi Kosugi, Koshi (JP); Takao Inada, Koshi (JP); Takashi Ikeda, Koshi (JP); Tsukasa Hirayama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 730 days.

(21) Appl. No.: 15/883,481

(22) Filed: Jan. 30, 2018

(65) Prior Publication Data

US 2018/0218924 A1    Aug. 2, 2018

(30) Foreign Application Priority Data

Feb. 1, 2017 (JP) .............................. JP2017-017082
Oct. 5, 2017 (JP) .............................. JP2017-195221

(51) Int. Cl.
*H01L 21/67* (2006.01)
*H01L 21/673* (2006.01)
*H01L 21/677* (2006.01)

(52) U.S. Cl.
CPC .. *H01L 21/67086* (2013.01); *H01L 21/67034* (2013.01); *H01L 21/67057* (2013.01);
(Continued)

(58) Field of Classification Search
CPC ......... H01L 21/67086; H01L 21/67057; H01L 21/67309
See application file for complete search history.

(56) References Cited

U.S. PATENT DOCUMENTS 5,887,602 A * 3/1999 Iwama .............. H01L 21/67057
 134/43
5,888,344 A * 3/1999 Ogami ................ H01L 21/6708
 156/345.18
(Continued)

FOREIGN PATENT DOCUMENTS

| JP | H07-122531 A | * | 5/1995 |
| JP | H09-181041 A1 | | 7/1997 |
| JP | 11102888 A | * | 4/1999 |

*Primary Examiner* — Karla A Moore
*Assistant Examiner* — Margaret D Klunk
(74) *Attorney, Agent, or Firm* — Burr & Brown, PLLC

(57) ABSTRACT

A substrate liquid treatment apparatus includes an inner tank configured to store a treatment liquid and having an upper opening, an outer tank disposed outside the inner tank, and a lid movable between a close position for closing the upper opening of the inner tank and an open position for opening the upper opening of the inner tank. The lid includes a main portion that covers the upper opening of the inner tank when the lid is positioned at the close position, and a splash shielding portion connected to the main portion. When the lid is positioned at the close position, the splash shielding portion extends from a position higher than an upper end of a side wall of the inner tank adjacent to the splash shielding portion to a position which is lower than the upper end of the side wall and which is on the outer tank side of the side wall.

11 Claims, 16 Drawing Sheets

(52) U.S. Cl.
CPC .. *H01L 21/67309* (2013.01); *H01L 21/67313* (2013.01); *H01L 21/67742* (2013.01); *H01L 21/67751* (2013.01); *H01L 21/67757* (2013.01)

(56) References Cited

U.S. PATENT DOCUMENTS

| | | | |
|---|---|---|---|
| 2005/0155976 A1* | 7/2005 | Hua | H01L 21/67057 220/826 |
| 2006/0024213 A1* | 2/2006 | Arai | H01L 21/67057 422/129 |
| 2006/0118140 A1* | 6/2006 | Nishimura | B08B 3/10 134/34 |
| 2013/0233354 A1* | 9/2013 | Miura | B08B 3/04 134/29 |
| 2016/0184859 A1* | 6/2016 | Kamimura | H01L 21/67086 216/84 |
| 2018/0247841 A1* | 8/2018 | Nagai | H01L 21/67086 |

\* cited by examiner

SUBSTRATE LIQUID TREATMENT APPARATUS

CROSS REFERENCE TO RELATED APPLICATIONS

This application is based upon and claims the benefit of priority from Japanese Patent Application No. 2017-017082 filed on Feb. 1, 2017, and Japanese Patent Application No. 2017-195221 filed on Oct. 5, 2017, the entire contents of which are incorporated herein by reference.

TECHNICAL FIELD

The present invention relates to a substrate liquid treatment apparatus for treating a substrate with a treatment liquid.

BACKGROUND ART

The manufacturing treatment of a semiconductor device includes a silicon nitride film etching step that immerses substrates such as semiconductor wafers in a phosphoric acid aqueous solution stored in a treatment tank to wet etch the silicon nitride film formed on the surface of the substrate. A liquid treatment apparatus used for such wet etching includes an inner tank that stores a treatment liquid (e.g., an aqueous solution of phosphoric acid), an outer tank that receives the treatment liquid overflowing from the inner tank, and a circulation pump and a circulation line that circulate the treatment liquid such that the treatment liquid discharged from the outer tank is returned to the inner tank.

The phosphoric acid aqueous solution in the inner tank is maintained in a boiling state. For this reason, every time the bubbles generated by boiling reach the liquid surface, droplets of the phosphoric acid aqueous solution are generated and scatter around the inner tank. If those droplets are scattered outside the outer tank, the environment around the treatment tank may be contaminated.

Japanese patent laid-open publication JPH09-181041A describes that an auto cover that opens only when the substrates are loaded and unloaded to and from the treatment tank is provided in order to prevent droplets of phosphoric acid aqueous solution from scattering around the treatment tank. However, the auto cover cannot sufficiently prevents droplets of phosphoric acid aqueous solution from scattering around the treatment tank.

SUMMARY OF THE INVENTION

The object of the invention is to provide a substrate liquid treatment apparatus having a structure that can prevent the splash of the treatment liquid scattering from the surface of the treatment liquid in the inner tank from reaching an unexpected area outside the inner tank.

In one embodiment of the present invention, there is provided a substrate liquid treatment apparatus, which includes: an inner tank configured to store a treatment liquid and having an upper opening; an outer tank disposed outside the inner tank; and a lid movable between a close position for closing the upper opening of the inner tank and an open position for opening the upper opening of the inner tank, wherein the lid includes: a main portion that covers the upper opening of the inner tank when the lid is positioned at the close position; and a splash shielding portion connected to the main portion, and wherein when the lid is positioned at the close position, the splash shielding portion extends from a position higher than an upper end of a side wall of the inner tank adjacent to the splash shielding portion to a position which is lower than the upper end of the side wall and which is on the outer tank side of the side wall.

According to the above embodiment of the present invention, the splash of the treatment liquid scattering from the surface of the treatment liquid in the inner tank is prevented from reaching an unexpected area outside the inner tank.

DETAILED DESCRIPTION OF THE INVENTION

Embodiments of the present invention will be described with reference to the attached drawings. First, the description is made to the whole structure of a substrate liquid treatment system 1A into which a substrate liquid treatment apparatus 1 in one embodiment of the present invention is incorporated.

Figure 1:
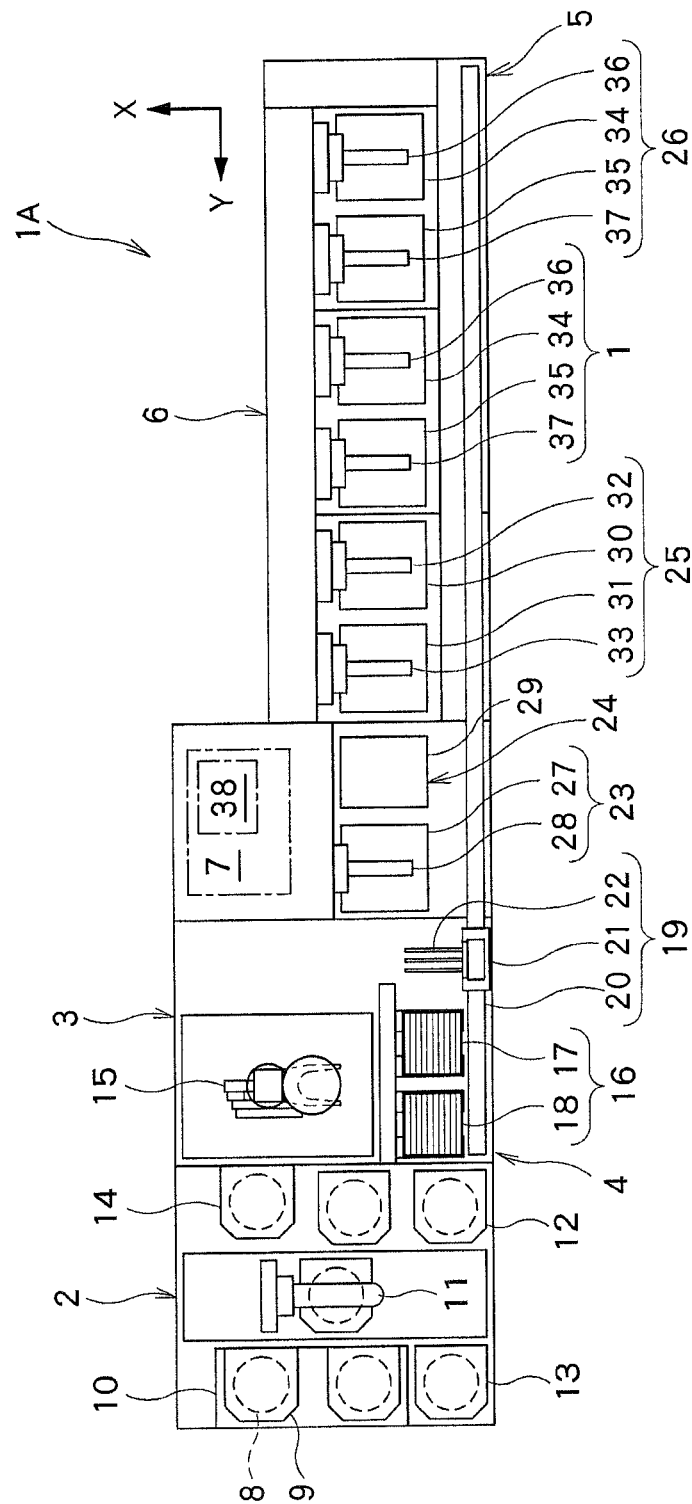
FIG. 1 is a schematic plan view showing the overall configuration of a substrate liquid treatment system.

As shown in FIG. 1, the substrate liquid treatment system 1A has a carrier in/out section 2, a lot forming section 3, a lot rack section 4, a lot conveyer section 5, a lot treatment section 6 and a control section 7.

The carrier in/out section 2 performs carrying-in/out of a carrier 9 containing a plurality of (e.g., twenty five) substrates (e.g., silicon wafers) 8 which are arrayed in the vertical direction in a horizontal posture.

The carrier in/out section 2 is provided with a carrier stage 10 configured to allow a plurality of carriers 9 to be placed thereon, a carrier transfer mechanism 11 that transfers a carrier 9, carrier stocks 12 and 13 each configured to allow a carrier 9 to be temporarily stored thereon, and a carrier stage 14 configured to allow a carrier 9 to be placed thereon. The carrier stock 12 temporarily stores the substrates 8 as product substrates, before the substrates 8 are treated in the lot treatment section 6. The carrier stock 13 temporarily stores the substrates 8 product substrates, after the substrates 8 are treated in the lot treatment section 6.

The carrier in/out section 2 transfers the carrier 9, which has been carried into the carrier stage 10 from outside, to the carrier stock 12 or the carrier stage 14 by using the carrier transfer mechanism 11. In addition, the carrier carry-in/out section 2 transfers the carrier 9, which is placed on the carrier stage 14, to the carrier stock 13 or the carrier stage 10 by using the carrier transfer mechanism 11. The carrier 9, which has been transferred to the carrier stage 10, is transferred to the outside.

The lot forming section 3 forms a lot consisting of a plurality of (e.g., fifty) substrates 8 to be simultaneously treated, by combining the substrates 8 accommodated in one or more carrier(s) 9. The lot may be formed such that the patterned surfaces of the substrates 8 are opposed to each other, or such that all the patterned surfaces of the substrates 8 are oriented in the same direction.

The lot forming section 3 is provided with a substrate transfer mechanism 15 that transfers a plurality of substrates 8. In the course of the transferring of the substrates 8, the substrate transfer mechanism 15 can change the posture of the substrates 8 from the horizontal posture to the vertical posture and vise versa.

The lot forming section 3 transfers the substrates 8 from the carrier 9 placed on the carrier stage 14 to the lot rack section 4 using the substrate transfer mechanism 15, and places the substrates 8 on the lot rack section 4 to form a lot. The lot forming section 3 also transfers a lot placed on the lot rack section 4 to the carrier 9 placed on the carrier stage 14, by the substrate transfer mechanism 15. The substrate transfer mechanism 15 has two substrate support units each for supporting a plurality of substrates 8, one being an untreated substrate support unit for supporting substrates 8 before being treated (before being transferred by the lot conveyer section 5), the other being a treated substrate support unit for supporting substrates 8 after being treated (after being transferred by the lot conveyer section 5). Thus, transferring of particles or the like adhered to the untreated substrates 8 to the treated substrates 8 can be prevented.

In the lot rack section 4, a lot, which is to be or has been transferred between the lot forming section 3 and the lot treatment section 6 by the lot conveyer section 5, is temporarily placed on lot racks 16 to be on standby.

The lot rack section 4 is provided with a lot rack 17 for carrying-in provided to allow a lot to be placed thereon before being treated (before being transferred by the lot conveyer section 5) and a lot rack 18 for carrying-out provided to allow a lot to be placed thereon after being treated (after being transferred by the lot conveyer section 5). On each of the lot racks 17 and 18, a plurality of substrates 8 of one lot are placed side by side in the back and forth direction in the vertical posture.

In the lot rack section 4, a lot formed in the lot forming section 3 is placed on the lot rack 17. The lot is then transferred to the lot treatment section 6 by the lot conveyer section 5. Also in the lot rack section 4, a lot transferred from the lot treatment section 6 by the lot conveyer section 5 is placed on the lot rack 18. The lot is then transferred to the lot forming section 3.

The lot conveyer section 5 transfers a lot between the lot rack section 4 and the lot treatment section 6, and also transfers a lot within the lot treatment section 6.

The lot conveyer section 5 is provided with a lot transfer mechanism 19 that transfers a lot. The lot transfer mechanism 19 is composed of a rail 20 arranged along the lot rack section 4 and the lot treatment section 6, and a mobile body 21 that moves along the rail 20 while holding a plurality of substrates 8. The mobile body 21 is provided with a substrate holder 22 capable of being moved back and forth. The substrate holder 22 is configured to hold a plurality of substrates 8 while they are arrayed side by side in the back and forth direction in the vertical posture.

The lot conveyer section 5 receives a lot placed on the lot rack 17 by the substrate holder 22 of the lot transfer mechanism 19, and delivers the lot to the lot treatment section 6. The lot conveyer section 5 also receives a lot having been treated in the lot treatment section 6 by the substrate holder 22 of the lot transfer mechanism 19, and transfers the lot to the lot rack 18. Further, the lot conveyer section 5 transfers the lot within the lot treatment section 6 by using the lot transfer mechanism 19.

The lot treatment section 6 performs a treatment, e.g., an etching treatment, a cleaning treatment, a drying treatment, etc., to a plurality of substrates 8 forming one lot which are arrayed side by side in the back and forth direction in the vertical posture.

In the lot treatment section 6, there are arranged side by side a drying apparatus 23 that performs the drying of substrates 8, a substrate holder cleaning apparatus 24 that performs the cleaning of the substrate holder 22, a cleaning apparatus 25 that performs the cleaning of substrates 8, and two etching apparatuses (substrate liquid treatment apparatuses) 1 according to the present invention, which is configured to perform the etching of substrates 8.

The drying apparatus 23 has a treatment tank 27, and a substrate lifting mechanism 28 provided in the treatment tank 27 so as to be vertically movable. The treatment tank 27 is supplied with a drying gas (e.g., IPA (isopropyl alcohol) or the like). On the substrate lifting mechanism 28, a plurality of substrates 8 of one lot are held side by side in the back and forth direction in the vertical posture. The drying apparatus 23 receives a lot from the substrate holder 22 of the lot transfer mechanism 19 by the substrate lifting mechanism 28, and moves the lot up and down by the substrate lifting mechanism 28 such that substrates 8 are dried by means of the drying gas supplied to the treatment tank 27. Then, the drying apparatus 23 transfers the lot from the substrate lifting mechanism 28 to the substrate holder 22 of the lot transfer mechanism 19.

The substrate holder cleaning apparatus 24 has a treatment tank 29 into which a cleaning liquid and a drying gas can be supplied. The substrate holder cleaning apparatus 24 cleans the substrate holder 22, by supplying the cleaning liquid and then supplying the drying gas to the substrate holder 22 of the lot transfer mechanism 19.

The cleaning apparatus 25 includes a treatment tank 30 for cleaning and a treatment tank 31 for rinsing. The treatment tanks 30 and 31 are provided with vertically-movable substrate lifting mechanisms 32 and 33, respectively. A cleaning liquid (e.g., SC-1) is stored in the treatment tank 30. A rinsing liquid (e.g., pure water) is stored in the treatment tank 31.

The etching apparatus 1 includes a treatment tank 34 for etching and a treatment tank 35 for rinsing. The treatment tanks 34 and 35 are provided with vertically-movable substrate lifting mechanisms 36 and 37, respectively. An etching liquid (e.g., phosphoric acid aqueous solution) is stored in the treatment tank 34. A rinsing liquid (e.g., pure water) is stored in the treatment tank 35. As described above, the etching apparatus 1 is the substrate liquid treatment apparatus in one embodiment of the present invention.

The cleaning apparatus 25 and the etching apparatus 1 have the same structure. The description will be made to the etching apparatus (substrate liquid treatment apparatus) 1. The substrate lifting mechanisms 36 holds a plurality of substrates 8 of one lot with the substrates being arrayed side by side to be held in the back and forth direction in the vertical posture. In the etching apparatus 1, the substrate lifting mechanism 36 receives a lot from the substrate holder 22 of the lot transfer mechanism 19, and the substrate lifting mechanism 36 moves the lot up and down, so that the lot is immersed into the etching liquid in the treatment tank 34 thereby to etch the substrates 8. Thereafter, the etching apparatus 1 delivers the lot from the substrate lifting mechanism 36 to the substrate holder 22 of the lot transfer mechanism 19. The substrate lifting mechanism 37 then receives the lot from the substrate holder 22 of the lot transfer mechanism 19, and the substrate lifting mechanism 37 moves the lot up and down, so that the lot is immersed in the rinsing liquid in the treatment tank 35 thereby to rinse the substrates 8. Thereafter, the lot is delivered from the substrate lifting mechanism 37 to the substrate holder 22 of the lot transfer mechanism 19.

The control section 7 controls operations of the respective sections (the carrier carry-in/out section 2, the lot forming section 3, the lot rack section 4, the lot conveyer section 5 and the lot treatment section 6 and the etching apparatus 1) of the substrate liquid treatment system 1A.

The control section 7 comprises, for example, a computer, and has a computer-readable storage medium 38. The storage medium 38 stores program that controls various treatments performed in the substrate liquid treatment apparatus 1. The control section 7 controls the operations of the substrate liquid treatment apparatus 1 by reading out and executing the program stored in the storage medium 38. The program may be one that has been stored in the computer-readable storage medium 38, or may be one that has been installed to the storage medium 38 of the control section 7 from another storage medium. The computer-readable storage medium 38 may be, for example, a hard disc (HD), a flexible disc (FD), a compact disc (CD), a magneto optical disc (MO), or a memory card.

As described above, in the treatment tank 34 of the etching apparatus 1, a liquid treatment (etching treatment) is performed to the substrates 8 by using, as a treatment liquid (etching liquid), a solution (phosphoric acid aqueous solution) of a chemical (phosphoric acid) having a predetermined concentration.

Figure 2:
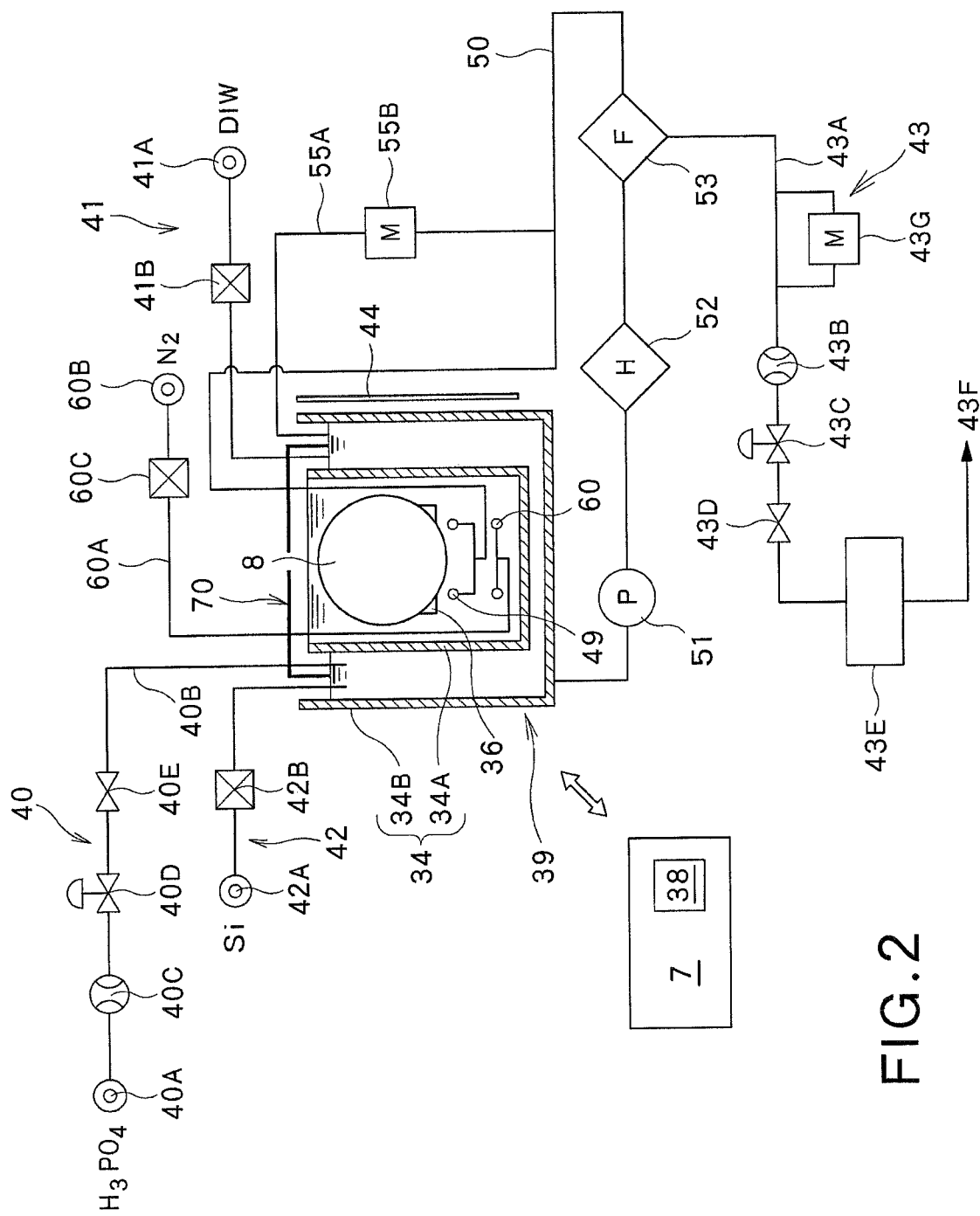
FIG. 2 is a diagram showing the structure of an etching apparatus incorporated in the substrate liquid treatment system.

Next, the structure and the piping system of the etching apparatus (substrate liquid treatment apparatus) 1 is described with reference FIG. 2.

The etching apparatus 1 has the aforementioned treatment tank 34 that stores, as a treatment liquid, a phosphoric acid aqueous solution having a predetermined concentration. The treatment tank 34 has an inner tank 34A and an outer tank 34B. A phosphoric acid aqueous solution overflowing from the inner tank 34A flows into the outer tank 34B. The liquid level in the outer tank 34B is maintained lower than the liquid level in the inner tank 34A.

An upstream end of a circulation line 50 is connected to the bottom of the outer tank 34B. A downstream end of the circulation line 50 is connected to treatment liquid supplying nozzles 49 disposed in the inner tank 34A. The circulation line 50 is provided with a pump 51, a heater 52 and a filter 53 in this order from the upstream side. By driving the pump 51, a circulation flow of the phosphoric acid aqueous solution is formed, which flows from the outer tank 34B through the circulation line 50 and the treatment liquid supplying nozzles 49 into the inner tank 34A, and then flows out therefrom into the outer tank 34B.

The treatment tank 34, the circulation line 50 and the devices (51, 52, 53 and so on) in the circulation line 50 constitute a liquid treatment unit 39. The treatment tank 34 and the circulation line 50 constitute a circulation system.

Gas nozzles 60 are provided in the inner tank 34A below the treatment liquid supplying nozzles 49 to discharge bubbles of an inert gas such as nitrogen gas into the phosphoric acid aqueous solution in the inner tank 34A (so as to perform bubbling). The inert gas such as nitrogen gas is supplied from a gas source 60B to the gas nozzles 60 through flow control devices 60C, which may composed of a shutoff valve, a flow control valve, a flowmeter, etc.

The treatment tank 34 is provided with the aforementioned substrate lifting mechanism 36. The substrate lifting mechanism 36 can hold a plurality of substrates 8 with the substrates 8 being arrayed at horizontal intervals in the vertical posture, and can move up and down under that condition.

The etching apparatus 1 includes a phosphoric acid aqueous solution supplying unit 40 that supplies the liquid treatment unit 39 with a phosphoric acid aqueous solution, a pure water supplying unit 41 that supplies the liquid treatment unit 39 with pure water, a silicon supplying unit 42 that supplies the liquid treatment unit 39 with a silicon solution, and a phosphoric acid aqueous solution draining unit 43 that drains the phosphoric acid aqueous solution from the liquid treatment unit 39.

The phosphoric acid aqueous solution supplying unit 40 supplies a phosphoric acid aqueous solution having a predetermined concentration into the circulation system formed of the treatment tank 34 and the circulation line 50, i.e., to any part in the liquid treatment unit 39, preferably to the outer tank 34B as illustrated. The phosphoric acid aqueous solution supplying unit 40 includes a phosphoric acid aqueous solution source 40A comprising a tank storing a phosphoric acid aqueous solution, a phosphoric acid aqueous solution supplying line 40B connecting the phosphoric acid aqueous solution source 40A and the outer tank 34B, and a flowmeter 40C, a flow rate regulating valve 40D and a shutoff valve 40E that are disposed on the phosphoric acid aqueous solution supplying line 40B in this order from the upstream side. The phosphoric acid aqueous solution supplying unit 40 can supply, to the outer tank 34B, a phosphoric acid aqueous solution at a controlled flow rate via the flowmeter 40C and the flow rate regulating valve 40D.

The pure water supplying unit 41 supplies pure water in order to replenish water that is lost by evaporation due to the heating of the phosphoric acid aqueous solution. The pure water supplying unit 41 includes a pure water source 41A that supplies pure water having a predetermined temperature. The pure water source 41A is connected to the outer tank 34B through a flow rate regulator 41B. The flow rate regulator 41B may be composed of a shutoff valve, a flow control valve, a flowmeter and so on.

The silicon supplying unit 42 has a silicon source 42A comprising a tank storing a silicon solution, for example, a liquid in which colloidal silicon is dispersed, and a flow rate regulator 42B. The flow rate regulator 42B may be composed of a shutoff valve, a flow rate regulating valve, a flowmeter and so on.

The phosphoric acid aqueous solution draining unit 43 is disposed for draining a phosphoric acid aqueous solution in the circulation system formed of the liquid treatment unit 39 and the circulation line 50, i.e., in the liquid treatment unit 39. The phosphoric acid aqueous solution draining unit 43 has a draining line 43A branched from the circulation line 50, and a flowmeter 43B, a flow control valve 43C, a shutoff valve 43D and a cooling tank 43E that are disposed on the draining line 43A in this order from the upstream side. The phosphoric acid aqueous solution draining unit 43 can drain a phosphoric acid aqueous solution at a controlled flow rate via the flowmeter 43B and the flow control valve 43C.

The cooling tank 43E temporarily stores a phosphoric acid aqueous solution flowing through the draining line 43A and cools the same. A phosphoric acid aqueous solution (see reference numeral 43F) flowing out from the cooling tank 43E may be discarded to a factory waste liquid system (not shown), or may be sent to the phosphoric acid aqueous solution source 40A for reuse after removing silicon contained in the phosphoric acid aqueous solution by a regeneration apparatus (not shown).

In the illustrated embodiment, the draining line 43A is connected to the circulation line 50 (the filter drain position in the illustration). However, not limited thereto, the draining line 43A may be connected to another part in the circulation system, e.g., the bottom of the inner tank 34A.

The draining line 43A is provided with a silicon concentration meter 43G that measures the silicon concentration in the phosphoric acid aqueous solution. A branch line 55A is branched from the circulation line 50 to be connected to the outer tank 34B. The branch line 55A is provided with a phosphoric acid concentration meter 55B that measures the phosphoric acid concentration in the phosphoric acid aqueous solution. The outer tank 34B is provided with a level meter 44 that detects the liquid level in the outer tank 34B.

Figure 3:
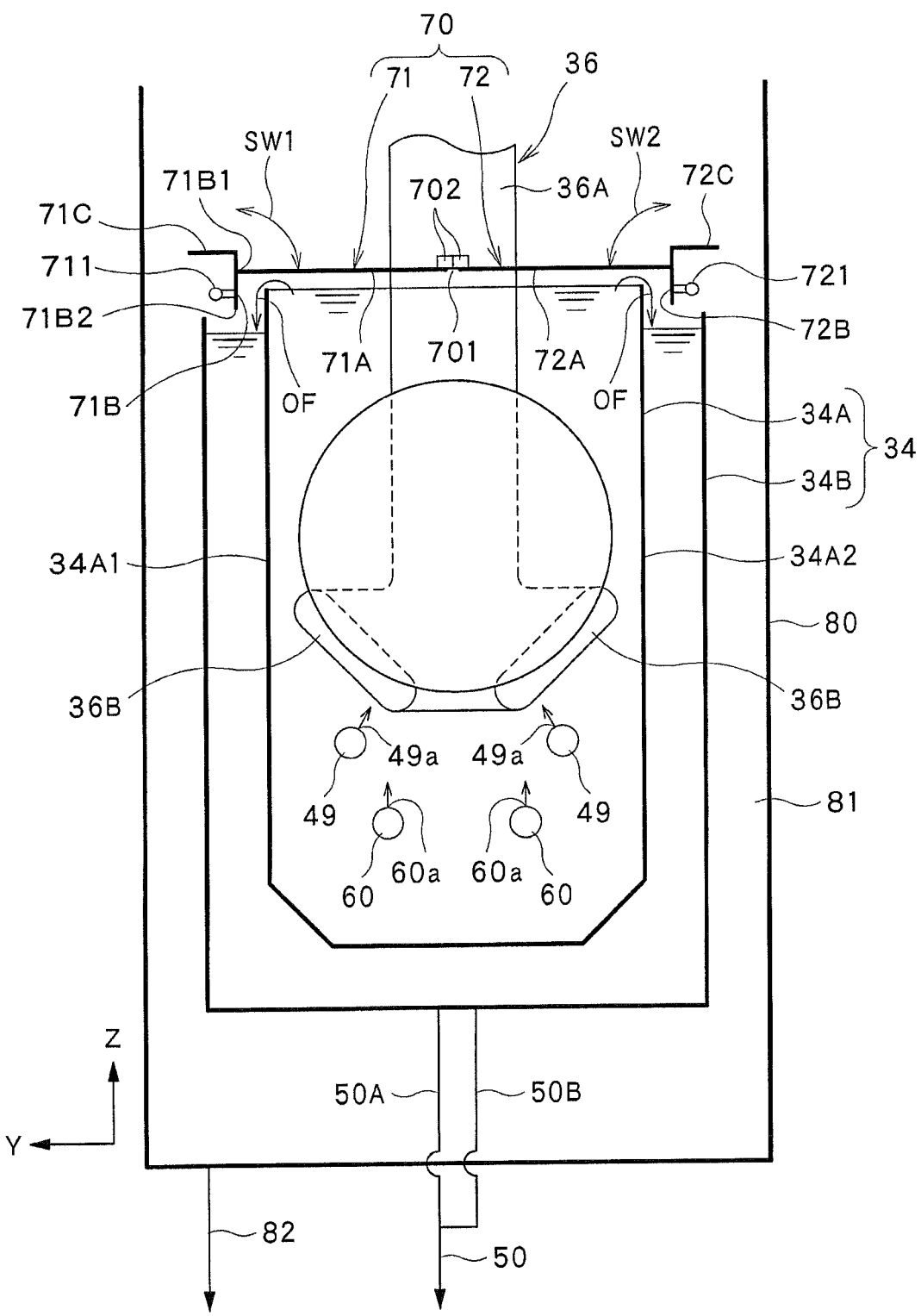
FIG. 3 is a schematic transverse vertical cross sectional view of a treatment tank when the lid is in the close position.
Figure 4:
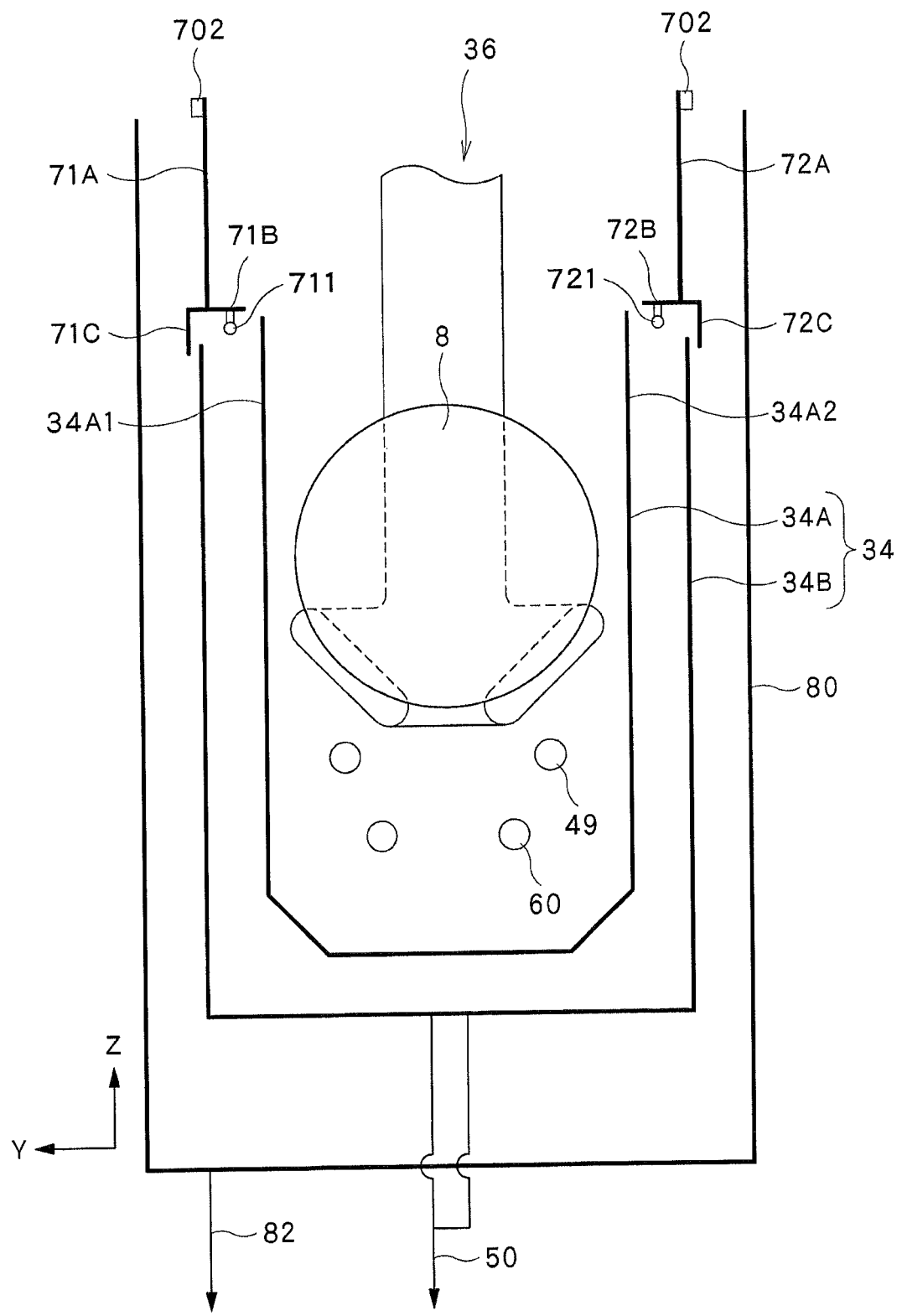
FIG. 4 is a schematic transverse vertical cross sectional view of the treatment tank when the lid is in the open position.
Figure 5:
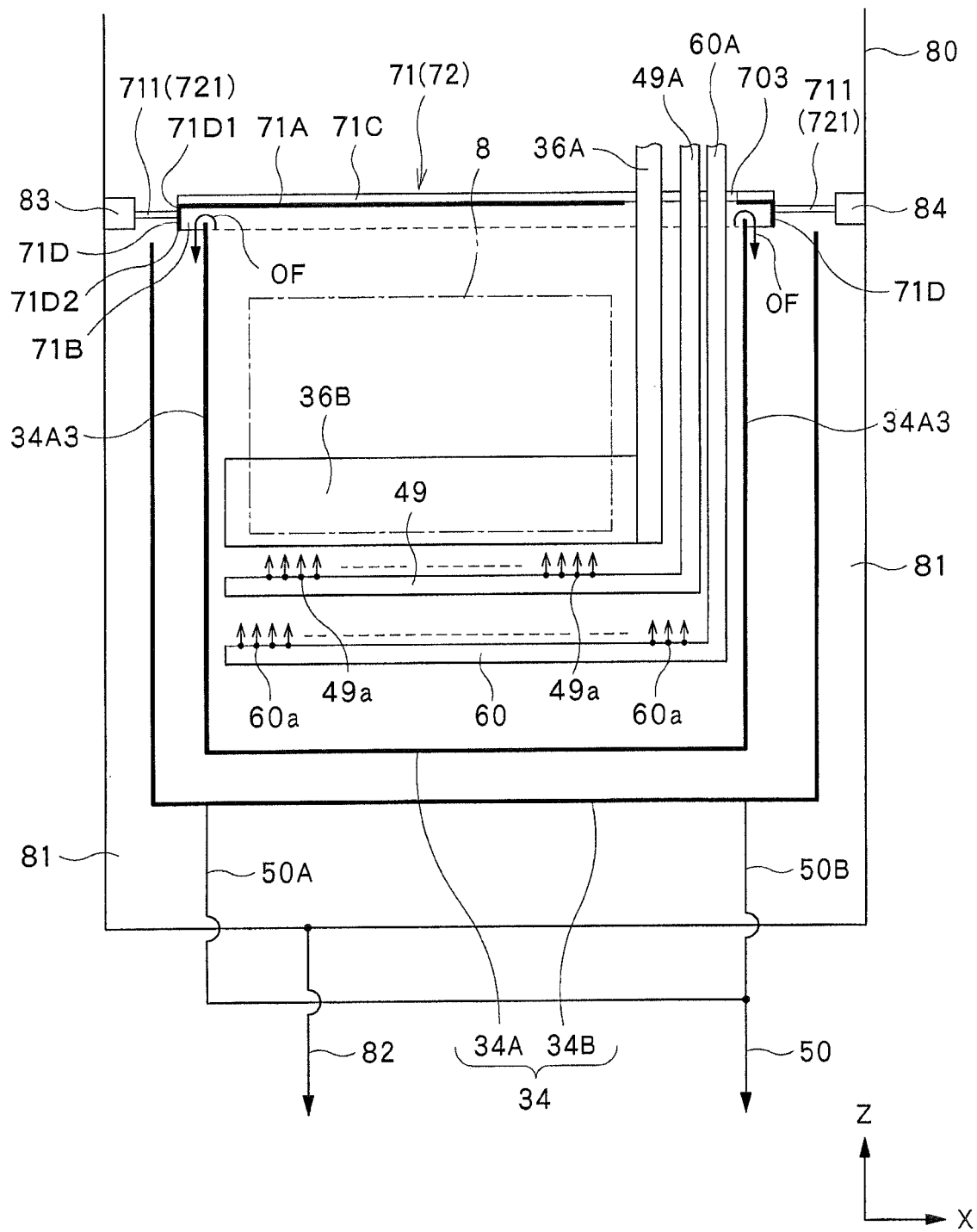
FIG. 5 is a schematic longitudinal vertical cross sectional view of the treatment tank when the lid is in the open position.

Next, the structure of the treatment tank 34 is described in detail, with reference to FIGS. 3 to 6. For the convenience of explanation, an XYZ rectangular coordinate is set, and reference is made thereto according to need. Sometimes, the left side (X negative direction) of FIG. 5 is referred to as "front side" or "forward", the right side (X positive direction) of FIG. 5 is referred to as "back side" or "backward", the lower side (Y negative direction) of FIG. 5 is referred to as "right side" or "rightward", and the upper side (Y positive direction) of FIG. 5 is referred to as "left side" or "leftward".

As described above, the treatment tank 34 includes the inner tank 34A having an upper opening, and the outer tank 34B having an upper opening. The inner tank 34A is accommodated inside the outer tank 34B. Thus, while the liquid treatment is being performed, most of the inner tank 34A including its bottom is immersed in the phosphoric acid aqueous solution. The phosphoric acid aqueous solution overflowing from the inner tank 34A flows into the outer tank 34B.

The treatment tank 34 (outer tank 34B) is accommodated inside a liquid receiving container (sink) 80. A draining space 81 is formed between the outer tank 34B and the liquid receiving container 80. A draining line 82 is connected to a bottom of the draining space 81.

Each treatment liquid supplying nozzle 49 is formed of a cylindrical body extending in the X direction (horizontal direction) within the inner tank 34A. The treatment liquid supplying nozzle 49 discharges, from a plurality of discharge holes 49a (see FIGS. 3 and 5) drilled in the circumferential surface of the nozzle 49, the treatment liquid toward the substrates 8 held by the substrate lifting mechanism 36. Although two treatment liquid supplying nozzles 49 are shown in the drawings, three or more treatment liquid supplying nozzles 49 may be provided.

Each gas nozzle 60 is formed of a cylindrical body extending in the X direction (horizontal direction) at a height position lower than the treatment liquid supplying nozzle 49 in the inner tank 34A. The gas nozzle 60 discharges, from a plurality of discharge holes 60a drilled in the circumferential surface of the nozzle 60 (see FIGS. 3 and 5), bubbles of an inert gas (such as nitrogen gas). The boiling condition of the phosphoric acid aqueous solution in the inner tank 34 can be stabilized by the inert gas bubbling.

The upper opening of the inner tank 34A can be closed by a lid apparatus 70. The lid apparatus 70 includes one or more lid(s), preferably two or more lids. In the illustrated example, the lid apparatus 70 includes two lids, i.e., a first lid (first lid part) 71 and a second (second lid part) 72. As shown by the arrows SW in FIG. 3, the first lid 71 and the second lid 72 are pivotable (rotatable) about respective rotation axes extending in the horizontal direction (X direction) to move between a close position for closing the upper opening of the inner tank 34A (position shown in FIG. 3) and an open position for opening the upper opening of the inner tank 34A (position shown in FIG. 4).

Except for the carrying-in/out of the substrates 8 held by the substrate lifting mechanism 36 to/from the inner tank 34A, the first lid 71 and the second lid 72 are usually positioned at the close position, so as to prevent the lowering of the temperature of the phosphoric acid aqueous solution in the inner tank 34A and to suppress the escape of vapor generated from the boiling phosphoric acid aqueous solution to the outside of the treatment tank 34.

Figure 6:
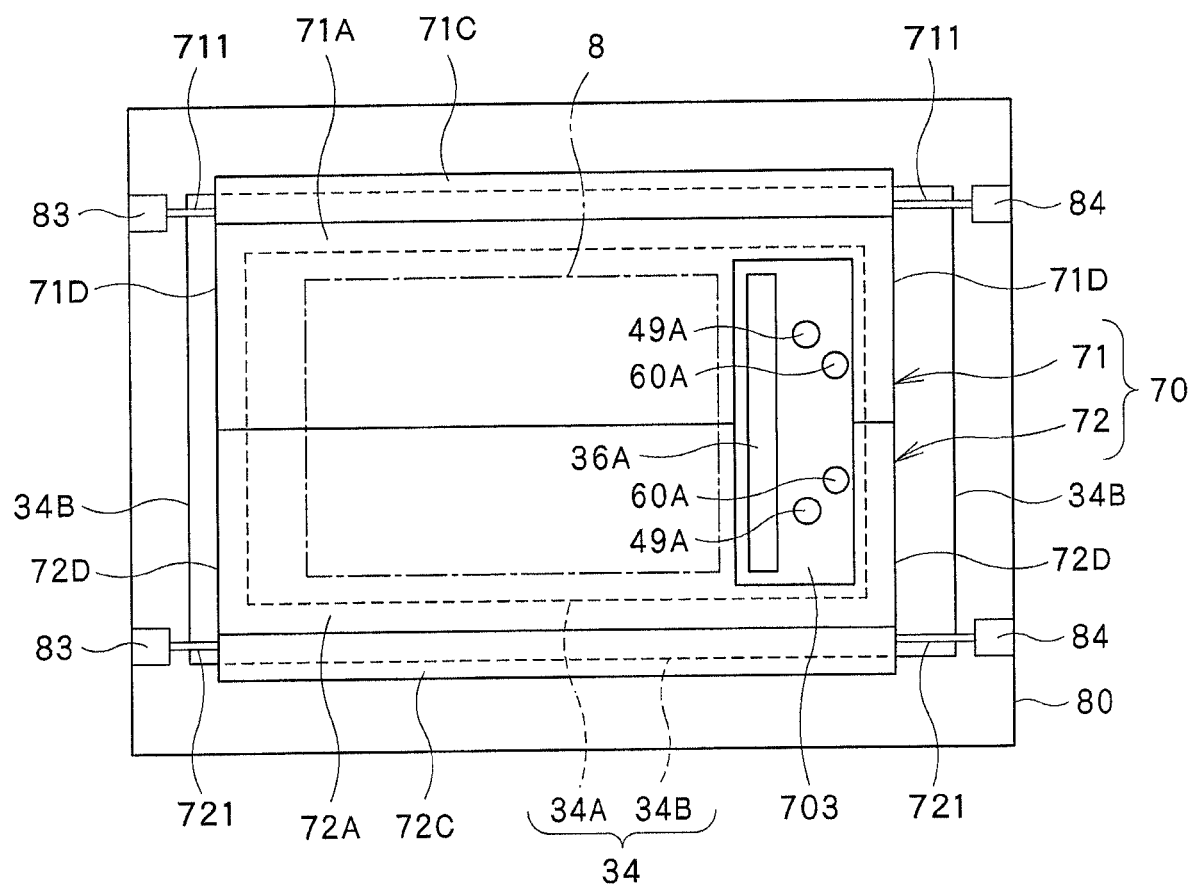
FIG. 6 is a schematic plan view of the treatment tank.

Rotation shafts 711 and 721 extending in the horizontal direction (X direction) are disposed on the left end part of the first lid 71 and on the right end part of the second lid 72 (see FIGS. 5 and 6). Each of the rotation shafts 711, 721 is connected to a bearing 83 and a rotary actuator 84 fixed to the liquid receiving container 80 (see FIGS. 5 and 6). By operating the rotary actuators 84, the first lid 71 and the second lid 72 can be opened and closed.

The first lid 71 includes a main portion 71A, a splash shielding portion 71B, a guiding portion 71C, and two splash shielding portions, i.e., front and back splash shielding portions 71D. The second lid 72 includes a main portion 72A, a splash shielding portion 72B, a guiding portion 72C, and two splash shielding portions, i.e., front and back splash shielding portions 72D.

The main portions 71A and 72A are both formed of substantially rectangular plate members. When the first lid 71 and the second lid 72 are in the close position, the main portions 71A and 72A are positioned at height positions higher than the liquid level of the phosphoric acid aqueous solution in the inner tank 34A, so as to cover the upper opening of the inner tank 34A.

When the first lid 71 is in the close position, the splash shielding portion 71B of the first lid 71 extends downward (in the Z negative direction in this example) from the long side of the main portion 71A (which is the side extending in the X direction and is more distant from the second lid 72). In other words, the splash shielding portion 71B extends downward from a connection 71B1 connected to the main portion 71A, which is located at a position higher than the upper end of a left sidewall 34A1 disposed on a position close to the splash shielding portion 71B, and terminates at a lower end 7162 located at a position lower than the upper end of the inner tank 34A.

Excluding a modified embodiment of FIG. 9 described later, upper ends of four sidewalls, i.e., front, back, left and right sidewalls 34A1, 34A2, 34A3 and 34A4 of the inner tank 34A are positioned on the same height. When the phosphoric acid aqueous solution overflows from the inner tank 34A to the outer tank 34B, the liquid level height of the phosphoric acid aqueous solution in the inner tank 34A is substantially identical (actually slightly higher) to the heights of the upper ends of the sidewalls 34A1, 34A2, 34A3 and 34A4.

The splash shielding portion 71B prevents the splash of the phosphoric acid aqueous solution, which scatters from the liquid surface of the boiling phosphoric acid aqueous solution in the inner tank 34A, from scattering outside the outer tank 34B through a gap between the first lid 71 and the upper end of the sidewall of the inner tank 34A. Since the lower end 71B2 of the splash shielding portion 71B is positioned between the inner tank 34A and the outer tank 34B, the splash of the phosphoric acid aqueous solution hitting onto the splash shielding portion 71B flows downward along the surface of the splash shielding portion 71B so as to fall down into the phosphoric acid aqueous solution existing in the outer tank 34B.

The two splash shielding portions 71D of the first lid 71 extend downward (in the Z negative direction in this example) from front and back short sides of the first lid 71 (which are sides extending in the Y direction). Each splash shielding portion 71D extends downward from a connection 71D1 (see FIG. 5) to the main portion 71A, which is located at a position higher than the upper end of the inner tank 34A (the upper end of the front (back) sidewall of the inner tanks 34A), and terminates at a lower end 71D2 (see FIG. 5) located at a position lower than the upper end of the inner tank 34A. The splash shielding portions 71D have the same function as that of the splash shielding portion 71B.

When the first lid 71 is in the open position (see FIG. 4), the main portion 71A of the first lid 71 prevents the splash of the phosphoric acid aqueous solution, which scatters from the liquid surface of the boiling phosphoric acid aqueous solution in the inner tank 34A, from reaching outside the outer tank 34B. FIGS. 4 and 5 do not illustrate the phosphoric acid aqueous solution in the treatment tank 34.

A gap is provided between the first lid 71 and the upper ends of the left and right sidewalls 34A1 and 34A2 of the inner tank 34A, in order not to interfere with the overflowing (shown by the arrows OF in FIGS. 3 and 5) of the phosphoric acid aqueous solution from the inner tank 34A to the outer tank 34B, when the first lid 71 is in the close position.

Although not shown, the upper ends of the four sidewalls 34A1, 34A2, 34A3 and 34A4 of the inner tank 34A are provided with a plurality of V-shaped cutouts arranged at intervals in order to allow smooth overflowing.

When the first lid 71 is positioned at the open position, the guiding portion 71C of the first lid 71 guides the liquid (e.g., liquid falling down from a wet substrate which moves above the treatment tank 34), which adheres to the upper surface of the main portion 71A when the first lid 71 is in the close position, to the draining space 81 between the outer tank 34B and the liquid receiving container 80, so as to prevent the liquid from flowing into the outer tank 34B (see FIG. 4). When the first lid 71 is in the open position, the lower end of the guiding portion 71C is positioned between the outer tank 34B and the liquid receiving container 80.

The second lid 72 has a form substantially mirror symmetric to the first lid 71, and the first lid 71 and the second lid 72 have substantially the same structure. Thus, the description about the structure and the operation of the first lid 71 can be applied to the description about the structure and the operation of the second lid 72. In addition, since the first lid 71 and the second lid 72 are formed substantially symmetrically in the back and forth direction (except for cutouts 703 described below), the front splash shielding portion 71D and the back splash shielding portion 71D have substantially the same function.

As shown in FIG. 3, when the first lid 71 and the second lid 72 are in the close position, a small gap 701 is formed between the distal end of the main portion 71A (the long side of the main portion 71A, which is closer to the main portion 72A) and the distal end of the main portion 72A (the long side of the main portion 72A, which is closer to the main portion 71A). Since the first lid 71 and the second lid 72 are generally made of quartz that is a material resistant to phosphoric acid. If there is no gap (701), cracks may be generated when the distal ends of the main portions 71A and 72A collide with each other.

The distal ends of the main portions 71A and 72A are equipped with seals 702 (shown in FIGS. 3 and 4/not shown in FIGS. 5 and 6) made of a resin material that cannot crack upon collision and has a relatively high corrosion resistance, such as PTFE (polytetrafluoroethylene). When the first lid 71 and the second lid 72 are in the close position, the seals 702 are in contact with each other so that escape of heat and vapor from the inner tank 34A can be suppressed.

As shown in FIGS. 5 and 6, the cutouts 703 are formed in the main portions 71A and 72A of the first lid 71 and the second lid 72, in order to allow a support plate 36A (which supports one end of a substrate support member 36B) of the substrate lifting mechanism 36, pipes 49A in communication with the treatment liquid supplying nozzles 49 and pipes 60A in communication with the gas nozzles 60, to pass therethrough.

Figure 9:
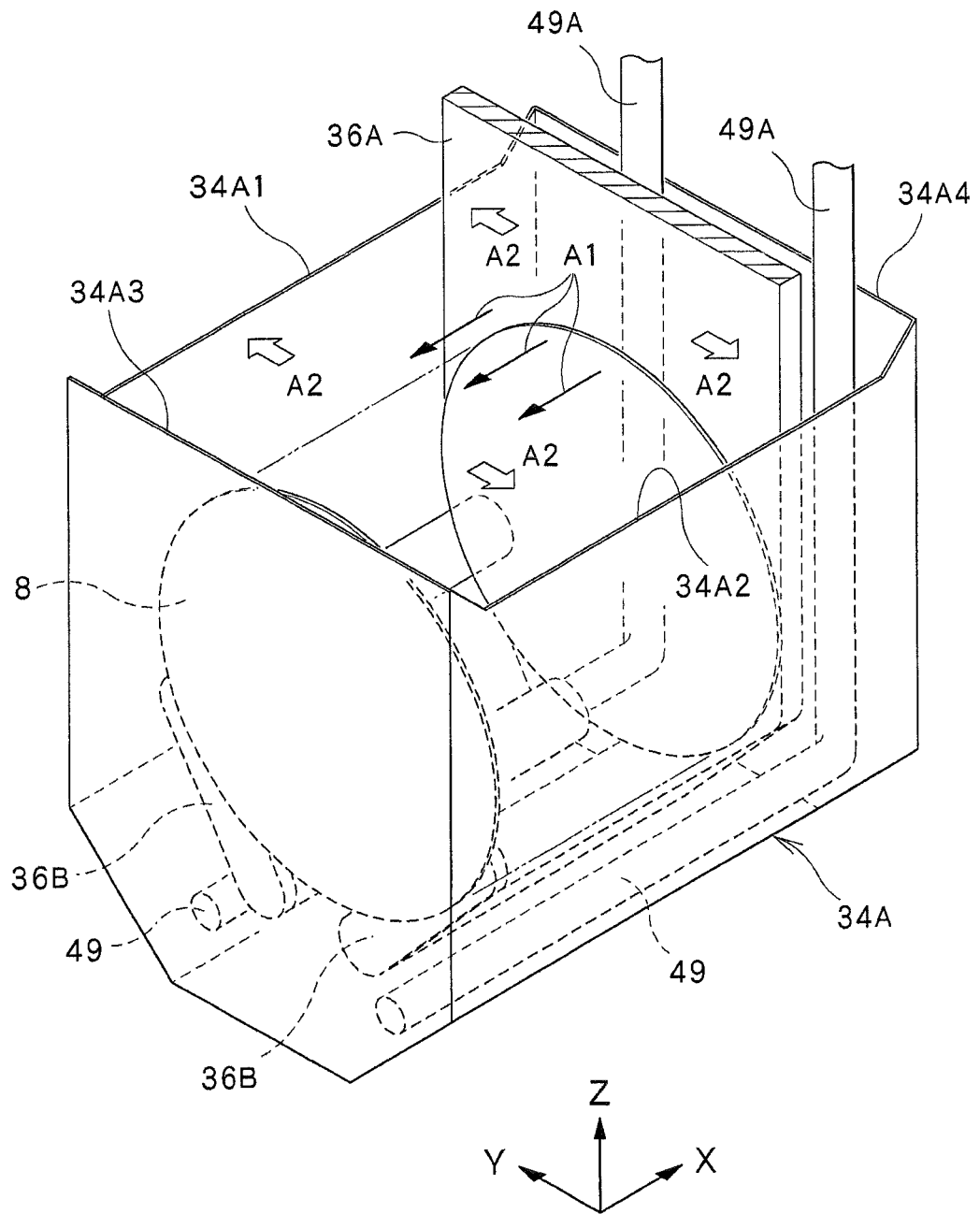
FIG. 9 is a schematic perspective view of a treatment tank in one modification.

The substrate lifting mechanism 36 includes the support plate 36A extending in the vertical direction (Z direction), which is moved up and down by a lifting mechanism, not shown, and a pair of the substrate support members 36B extending in the horizontal direction (X direction) (see also FIG. 9). One end of the substrate support member 36B is supported by the support plate 36A. Each substrate support member 36B has a plurality of (e.g., 50-52 (fifty to fifty two)) substrate support grooves (not shown) arranged at intervals in the horizontal direction (X direction). The circumferential edge of the substrate 8 is inserted into the substrate support groove. The substrate lifting mechanism 36 can hold a plurality of (e.g., fifty to fifty two) substrates 8 at intervals in the horizontal direction (X direction) in the vertical posture. Such a substrate lifting mechanism 36 is well known in this technical field, and thus illustration and description of the detailed structure thereof are omitted.

In this embodiment, the upstream end of the circulation line 50 to be connected to the bottom wall of the outer tank 34B branches into two branch lines 50A and 50B (see FIG. 5). The two branch lines 50A and 50B are connected to the bottom wall of the outer tank 34B at different positions in the X direction (specifically, positions close to the front end and the back end of the outer tank 34B). The two branch lines 50A and 50B are connected to the central portion of the bottom wall of the outer tank 34B with respect to the Y direction.

The support plate 36A of the substrate lifting mechanism 36 is inserted to a back part of the inner tank 34A. The support plate 36A has an effect on a flow rate distribution of the overflow from the inner tank 34A to the outer tank 34B. That is, the flow rate of the overflow from the back part of the inner tank 34A is significantly small, while the flow rates of the overflows from the front part, the left part and the right part of the inner tank 34A are large. Thus, since a hot liquid is less likely to flow into the back part of the outer tank 34B from the inner tank 34A, the upper part of the back part of the outer tank 34B tends to have a lower temperature. In addition, since the flow rate of the overflow from the back part of the inner tank 34A is small, a gentle flow from the back part toward the front part is generated near the liquid surface of the phosphoric acid aqueous solution in the inner tank 34A (also see the arrows A1 in FIG. 9). Since the temperature of the phosphoric acid aqueous solution lowers near the liquid surface because of the heat release at the gas-liquid interface, the temperature of the phosphoric acid aqueous solution overflowing from the front part of the inner tank 34A to the outer tank 34B is relatively low.

In a case where the liquid having a low temperature stagnates in the upper parts of the front part and the back part of the outer tank 34B, the temperature distribution of the phosphoric acid aqueous solution in the inner tank 34A is adversely affected. By positively sucking the phosphoric acid aqueous solution by the branch lines 50A and 50B from the front part and the back part of the outer tank 34B, the temperature of the phosphoric acid aqueous solution in the outer tank 34B can be made uniform. As a result, the temperature of the phosphoric acid aqueous solution in the inner tank 34A immersed in the phosphoric acid aqueous solution in the outer tank 34B can be made uniform, whereby in-plane and inter-plane treatment uniformity of the substrates 8 can be improved.

Next, an operation of the above etching apparatus 1 is described. Firstly, the phosphoric acid aqueous solution supplying unit 40 supplies the phosphoric acid aqueous solution to the outer tank 34B of the liquid treatment unit 39. When a predetermined period of time has passed after the start of the supply of the phosphoric acid aqueous solution, the pump 51 on the circulation line 50 is activated, so that the aforementioned circulation flow circulating the circulation system is generated.

Further, the heater 52 on the circulation line 50 is activated such that the phosphoric acid aqueous solution in the inner tank 34A is heated up to a predetermined temperature (e.g., 160° C.). By the time point for starting heating by the heater 52 at the latest, the first lid 71 and the second lid 72 are moved to the close position. The phosphoric acid aqueous solution at 160° C. is boiling. When the phosphoric acid concentration measured by the phosphoric acid concentration meter 55B exceeds a predetermined management upper limit because of water evaporation caused by boiling, pure water is supplied from the pure water supplying unit 41.

Before substrates 8 of one lot are put into a phosphoric acid aqueous solution in the inner tank 34A, the silicon concentration (which exerts an influence on the etching selection ratio of silicon nitride films with respect to silicon oxide films) in the phosphoric acid aqueous solution present in the circulation system (including the inner tank 34A, the outer tank 34B and the circulation line 50) is adjusted. The adjustment of the silicon concentration can be performed by immersing a dummy substrate into the phosphoric acid aqueous solution in the inner tank 34A, or by supplying a silicon solution from the silicon supplying unit 42 to the outer tank 34B. The phosphoric acid aqueous solution may be caused to flow through the draining line 43A so that the silicon concentration meter 43G can measure the silicon concentration, in order to confirm that the silicon concentration of the phosphoric acid aqueous solution present in the circulation system falls within a predetermined range.

After the adjustment of the silicon concentration has completed, the first lid 71 and the second lid 72 are moved to the open position, and a plurality of, e.g., fifty substrates 8, which form one lot (referred to also as "treatment lot" or "batch") and are held by the substrate lifting mechanism 36, are immersed into the phosphoric acid aqueous solution in the inner tank 34A. Immediately thereafter, the first lid 71 and the second lid 72 are returned to the close position. By immersing the substrates 8 in the phosphoric acid aqueous solution for a predetermined period of time, the substrates 8 are subjected to a wet etching treatment (liquid treatment).

By keeping the first lid 71 and the second lid 72 in the close position during the etching treatment of the substrates 8, lowering of the temperature of a part near the liquid surface of the phosphoric acid aqueous solution in the inner tank 34A can be suppressed, whereby the temperature distribution of the phosphoric acid aqueous solution in the inner tank 34A can be made small. In addition, since the inner tank 34A is immersed in the phosphoric acid aqueous solution in the outer tank 34B, lowering of the temperature of the phosphoric acid aqueous solution in the inner tank 34A, which is caused by the heat release from the wall of the inner tank 34A, can be suppressed, whereby the temperature distribution of the phosphoric acid aqueous solution in the inner tank 34A can be made small. Thus, the in-plane uniformity and the inter-plane uniformity of the etching amount of the substrates 8 can be maintained high.

During the treatment of the substrates 8 of one lot, since silicon elutes from the substrates 8, the silicon concentration of the phosphoric acid aqueous solution present in the circulation system increases. In order to maintain the silicon concentration in the phosphoric acid aqueous solution present in the circulation system during the treatment of the substrates 8 of one lot, or in order to vary the silicon concentration purposely, it is possible to supply the phosphoric acid aqueous solution by the phosphoric acid aqueous solution supplying unit 40, while draining the phosphoric acid aqueous solution present in the circulation system by the phosphoric acid aqueous solution draining unit 43.

When the treatment of the substrates 8 of one lot is completed as described above, the first lid 71 and the second lid 72 are moved to the open position, and the substrates 8 are carried out from the inner tank 34A.

After that, the first lid 71 and the second lid 72 are moved again to the close position, the temperature, the phosphoric acid concentration and the silicon concentration of the phosphoric acid aqueous solution are adjusted. Thereafter, substrates 8 of another lot are treated similarly to the above.

According to the above embodiment, the splash shielding portions 71B and 71D of the first lid 71 and the splash shielding portions 72B and 72D of the second lid 72 can prevent the splash of the phosphoric acid aqueous solution, which scatters from the liquid surface of the boiling phosphoric acid aqueous solution in the inner tank 34A, from reaching outside the outer tank 34B. Thus, the phosphoric acid aqueous solution can be prevented from entering the draining space 81 between the liquid receiving container 80 and the outer tank 34B. If the phosphoric acid aqueous solution enters the draining space 81 and becomes solidified there, the draining line 82 is possibly clogged up. If the above splash shielding portions 71B, 71D, 72B and 72D are not provided and the liquid receiving container 80 is also not provided, there is a possibility that the area surrounding the treatment tank 34 is possibly contaminated by contaminants derived from the phosphoric acid aqueous solution.

The splash shielding portions 71B and 71D of the first lid 71 and the splash shielding portions 726 and 72D of the second lid 72 guide the splash of the phosphoric acid aqueous solution scattered thereto into the phosphoric acid aqueous solution present in the outer tank 34B. Thus, since the components of the phosphoric acid aqueous solution present in the circulation system of the phosphoric acid aqueous solution do not go outside the circulation system, it is easy to control the phosphoric acid concentration and the silicon concentration.

Because of the performance of the sensor, the detection of the silicon concentration at a high response speed is difficult. Thus, it is difficult to feedback-control the silicon concentration at a high response speed. Thus, in the actual operation of this apparatus, the silicon concentration in the phosphoric acid aqueous solution present in the circulation system is controlled by draining a predetermined amount of the phosphoric acid aqueous solution in use and by adding a predetermined amount of a new phosphoric acid aqueous solution at predetermined timings specified by a process recipe, which timings are determined based on the change of the silicon concentration obtained by a preparatory test. In such a control, when the phosphoric acid aqueous solution is scattered so that silicon is lost from the circulation system, it is difficult to maintain the silicon concentration in the phosphoric acid aqueous solution at an intended value. On the other hand, in this embodiment, since the splash shielding portions 71B, 71D, 72B and 72D prevent the phosphoric acid aqueous solution from going outside the circulation system, it is easy to control the silicon concentration in the phosphoric acid aqueous solution at an intended value.

The structure and the layout of the first lid 71 and the second lid 72 are not limited to the above.

Figure 7:
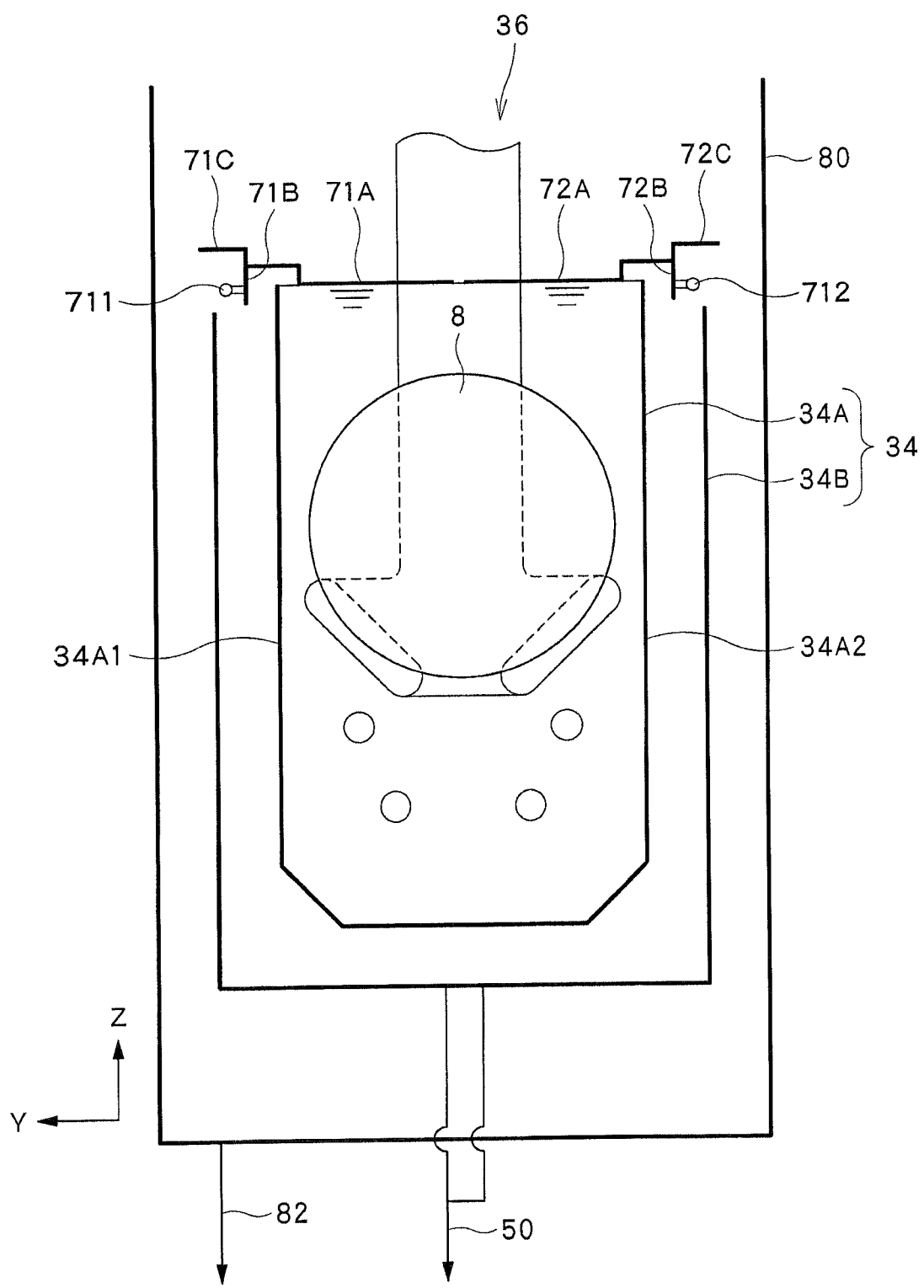
FIG. 7 is a schematic transverse vertical cross sectional view of a lid in one modification.

For example, as shown in FIG. 7, the first lid 71 and the second lid 72 may be configured such that, when the first lid 71 and the second lid 72 are in the close position, the main portions 71A and 72A are positioned at substantially the same height as the upper ends of the respective sidewalls of the inner tank 34A (i.e., the liquid level of the phosphoric acid aqueous solution in the inner tank 34A). Since the lower surfaces of the main portions 71A and 72A of the first lid 71 and the second lid 72, and the liquid surface of the phosphoric acid aqueous solution are in contact with each other, there is no heat release at the gas-liquid interface, which makes it easy to maintain the phosphoric acid aqueous solution at a high temperature. In addition, since the phosphoric acid aqueous solution adhered to the lower surfaces of the main portions 71A and 72A of the first lid 71 and the second lid 72 is not cooled to be solidified (crystallized), a problematic situation where the inside of the inner tank 34A cannot be seen from the upper surface of the main portion 71A of the first lid 71 or the main portion 72A of the second lid 72 can be avoided. According to the modified embodiment shown in FIG. 7, as compared with the embodiment in which the lower surfaces of the main portions 71A and 72A are spaced apart from the liquid surface of the phosphoric acid aqueous solution, the lowering of the temperature of the phosphoric acid aqueous solution near the liquid surface, which is caused by the heat release at the gas-liquid interface, can be significantly decreased, whereby the temperature distribution in the inner tank 34A can be made small. In the modified embodiment shown in FIG. 7, the same reference numerals are given to the same parts shown in FIGS. 3 to 6, and duplicative description is omitted.

Figure 8:
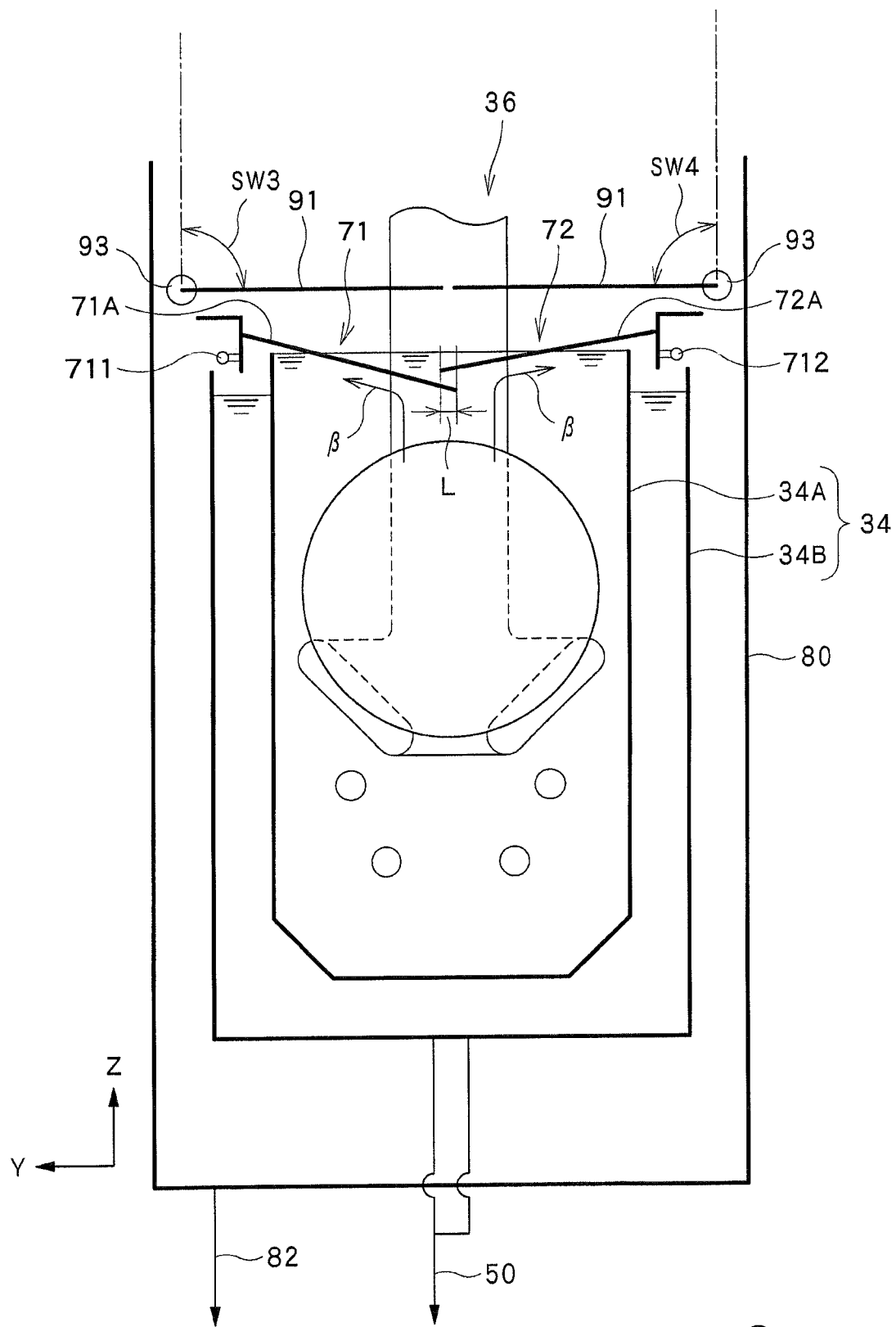
FIG. 8 is a schematic transverse vertical cross sectional view of a lid in another modification.

As shown in FIG. 8, the main portions 71A and 72A of the first lid 71 and the second lid 72 may be inclined, and first and second auxiliary lids 91 and 92 may be further disposed above the first lid 71 and the second lid 72. In the modified embodiment shown in FIG. 8, the same reference numerals are given to the same parts shown in FIGS. 3 to 7, and duplicative description is omitted.

In the modified embodiment shown in FIG. 8, when the first lid 71 and the second lid 72 are in the close position, the main portions 71A and 72A are inclined such that they gradually lower as approaching their distal ends, and the distal end portions of the main portions 71A and 72A are immersed in the phosphoric acid aqueous solution in the inner tank 34A. The distal end portion of the main portion 71A and the distal end portion of the main portion 72A are overlapped each other with an overlap margin L. That is, in a plan view (seen from above), the distal end portion of the main portion 71A and the distal end portion of the main portion 72A are overlapped each other. The distal end of the main portion 71A is positioned below the distal end of the main portion 72A, and the distal end portion of the main portion 71A and the distal end portion of the main portion 72A are not in contact with each other.

The first auxiliary lid 91 and the second auxiliary lid 92 are made of a resin material having a suitable corrosion resistance, e.g., PTFE. As shown by the arrows SW3 and SW4, the first auxiliary lid 91 and the second auxiliary lid 92 can be pivoted (rotated) by rotary actuators 93 about rotation axes extending in the horizontal direction (X direction), so as to be movable between a close poison shown by the solid lines and an open position shown by the chain lines. The first auxiliary lid 91 and the second auxiliary lid 92 are equipped with cutouts (not shown) which function similarly to the cutout 703 provided in the main portion 71A and the main portion 72A.

Figure 13:
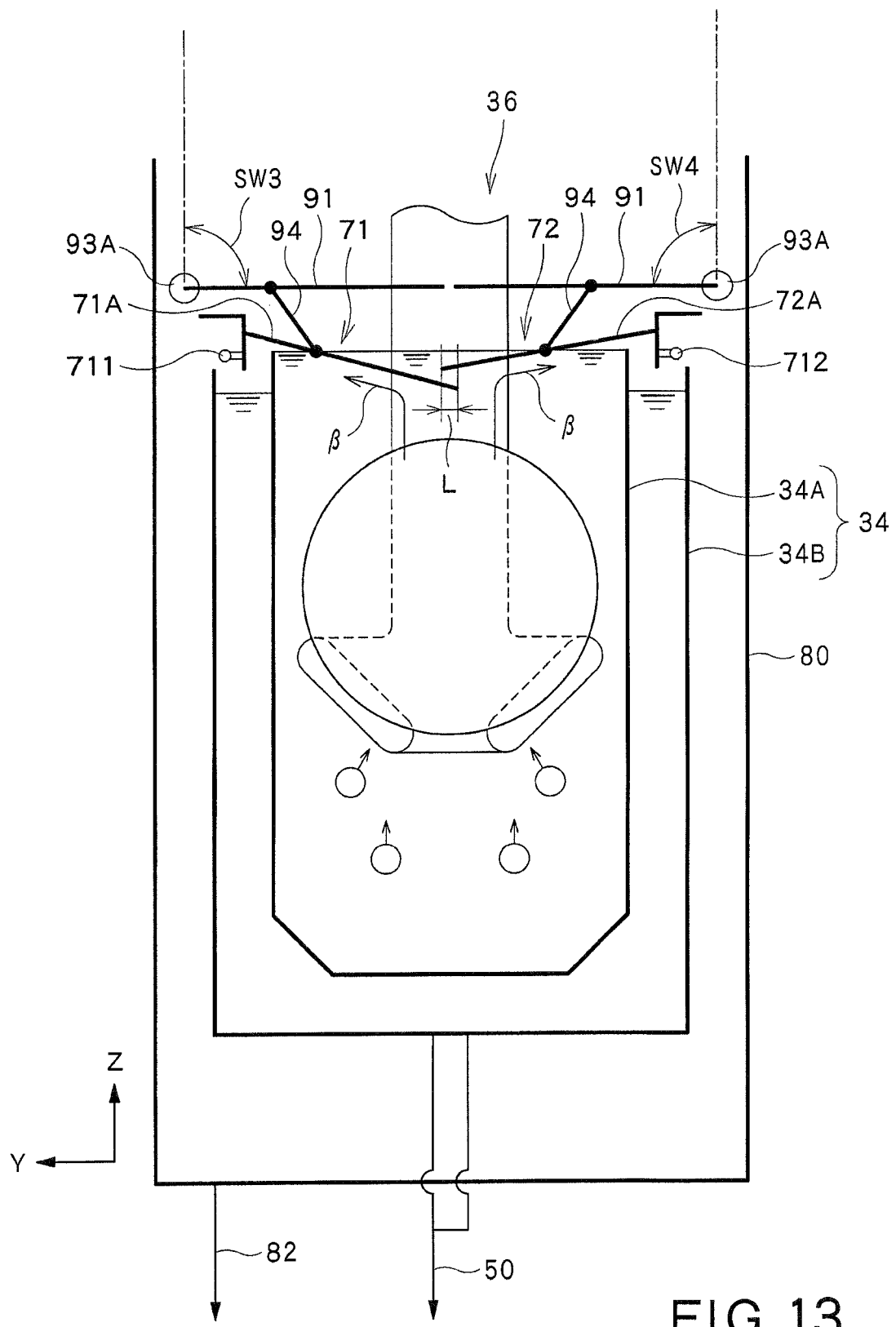
FIG. 13 is a schematic transverse vertical cross sectional view of a treatment tank in yet another modification.

One of the rotary actuators 84 for driving the first lid 71 and the second lid 72 and the rotary actuator 93 for driving the first auxiliary lid 91 and the second auxiliary lid 92 can be omitted, by connecting the first lid 71 and the first auxiliary lid 91 by a connection member such that they are rotated in conjunction with each other, and by connecting the second lid 72 and the second auxiliary lid 92 by a connection member such that they are rotated interlocked with each other. FIG. 13 schematically shows a case where connecting rods 94 are used as the above connection members, and the rotary actuator 93 is omitted. In this case, in order to achieve smooth operation, for example, it is preferable that a point corresponding to the rotation axis of the first lid 71 (the rotation axis of the rotary actuator 84), a point corresponding to a rotation axis 93A of the first auxiliary lid 91 (which is on the same position as the rotation axis of the omitted rotary actuator 93), a point at which the connection rod 94 is pivotably connected to the first lid 71, and a point at which the connection rod 94 is pivotably connected to the first auxiliary lid 91 form a parallelogram. In addition, when the first lid 71 is in the close position, it is preferable that the point at which the connection rod 94 is pivotably connected to the first lid 71 is located above the liquid level of the phosphoric acid aqueous solution in the inner tank 34A (although such arrangement is not shown in FIG. 13). The second lid 72, the second auxiliary lid 92 and the corresponding connection rod 94 may have the same relationship.

The modified embodiment shown in FIG. 8 has the same operation as that of the above embodiment and achieves the same effect. Further, in the modified embodiment shown in FIG. 8, the main portions 71A and 72A are inclined so as to be immersed in the phosphoric acid aqueous solution in the inner tank 34A. Thus, bubbles of an inert gas discharged from the gas nozzles 60 and bubbles generated by the boiling phosphoric acid aqueous solution approach the right and left sidewalls of the inner tank 34A, while elevating along the lower surfaces of the main portion 71A and the main portion 72A (see the arrows β in FIG. 8). Thus, the bubbles move together with the flow of the phosphoric acid aqueous solution overflowing over the upper ends of the left and right sidewalls 34A1 and 34A2 of the inner tank 34A so as to be efficiently discharged to the outer tank 34B.

Further, since the distal end portion of the main portion 71A and the distal end portion of the main portion 72A are overlapped each other, and the distal end portion of the main portion 71A and the distal end portion the main portion 72A are not in contact with each other, the bubbles moving upward in the phosphoric acid aqueous solution of the inner tank 34A do not stagnate between the main portion 71A and the main portion 72A, but are inevitably guided toward the sidewall 34A1 or 34A2 of the inner tank 34A by any one of the main portion 71A and the main portion 72A. Thus, the bubbles can be more efficiently discharged from the inner tank 34A.

A part of the phosphoric acid aqueous solution present in the inner tank 34A is positioned above the main portions 71A and 72A. The liquid above the main portions 71A and 72A is likely to cool. In addition, there is a possibility that liquid falls onto the liquid positioned above the main portions 71A and 72A from wet substrates 8 which are being transferred in a space above the inner tank 34A. However, the first auxiliary lid 91 and the second auxiliary lid 92 suppress the cooling of the phosphoric acid aqueous solution in the inner tank 34A, and prevent the liquid, which falls from the wet substrates 8 transferred above the inner tank 34A, from being mixed into the phosphoric acid aqueous solution in the inner tank 34A.

In the above various embodiments, as shown in FIG. 9, it is preferable that the heights of the left and right sidewalls 34A1 and 34A2 of the inner tank 34A are lower. As described above, the support plate 36A of the substrate lifting mechanism 36 disturbs the flow of the phosphoric acid aqueous solution flowing out from the inner tank 34A to the outer tank 34B over the back sidewall 34A4 of the inner tank 34A. Thus, if the left and right sidewalls 34A1 and 34A2, the front sidewall 34A3 and the back sidewall 34A4 of the inner tank 34A have the same height, there is generated a gentle liquid flow from the back sidewall 34A4 toward the front sidewall 34A3 (see the arrows A1 in FIG. 9), near the liquid surface of the phosphoric acid aqueous solution in the inner tank 34A. The liquid near the liquid surface is likely to cool by the heat release at the gas-liquid interface. When the cooled liquid flows from the back sidewall 34A4 toward the front sidewall 34A3, the temperature distribution uniformity in the inner tank 34A is deteriorated.

However, since the left and right sidewalls 34A1 and the 34A2 have lower heights, the liquid in the inner tank 34A flows out to the outer tank 34B over the left and right sidewalls 34A1 and 34A2 symmetrically in the right and left direction, at a relatively high flow speed (see arrows A2 in FIG. 9). In addition, the flow speed distribution of the flow A2 in the back and forth direction can be made uniform. Thus, the temperature distribution uniformity in the inner tank 34A can be improved.

In a case where the structure shown in FIG. 9 is employed, positively suctioning the phosphoric acid aqueous solution from the front part and the back part of the outer tank 34B by the branch lines 50A and 50B connected to the back and the front of the outer tank 34B is also advantageous in making uniform the temperature distribution in the inner tank 34A. This is because, in the case where the structure shown in FIG. 9 is employed, the cooled liquid tends to stagnate in the upper part of the front part and the back part of the outer tank 34B, so that the temperature distribution in the outer tank 34B exerts an influence on the temperature distribution in the inner tank 34A.

Figure 10:
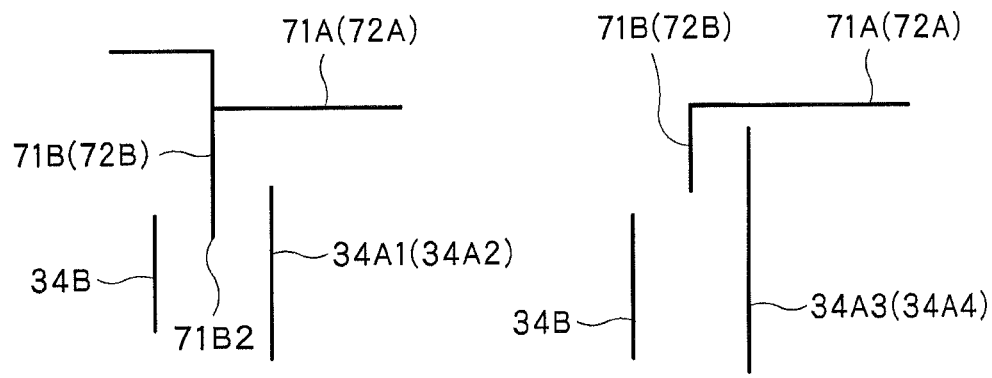
FIG. 10 is a schematic diagram of a lid adapted to the treatment tank of FIG. 9.
Figure 11:
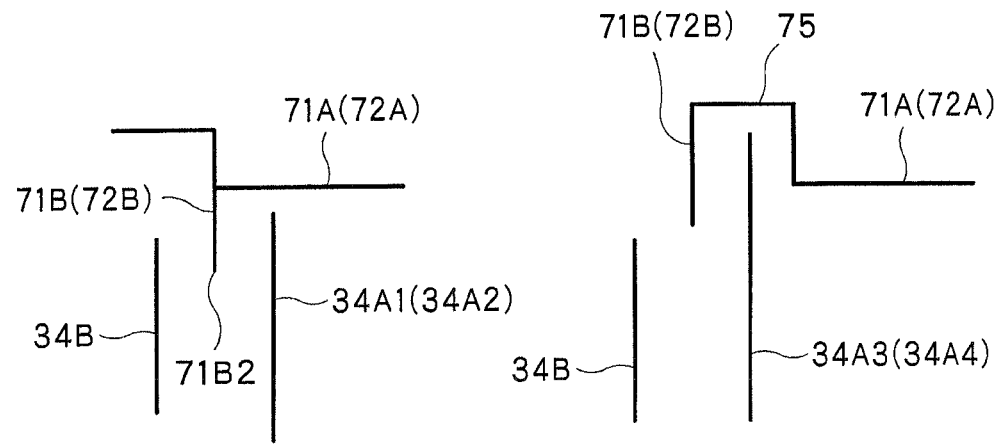
FIG. 11 is a schematic diagram of a lid adapted to the treatment tank of FIG. 9.

In the case where the structure shown in FIG. 9 is employed, the main portions 71A and 72A and the splash shielding portions 71B, 71D, 72B and 72D of the lids 71 and 72 may be configured as shown in FIG. 10 or 11.

In the example of FIG. 10, the height position of the main portion 71A, 72A of the lid 71, 72 in the close position is set correspondingly to the height position of the higher sidewall 34A3, 34A4. In this case, the lower end of the splash shielding portion 71B, 72B corresponding to lower sidewall 34A1, 34A2 may extend below the splash shielding portion 71D, 72D corresponding to the higher sidewall 34A3, 34A4.

In the example of FIG. 11, the height position of the main portion 71A, 72A of the lid 71, 72 in the close position is set correspondingly to the height position of the lower sidewall 34A1, 34A2. In this case, an end area 75 of the main portion 71A, 72A is stepped near the higher sidewall 34A2, 34A4 such that the end areas 75 are elevated. The splash shielding portion 71B, 72B extending downward from the ends of the elevated end areas 75 of the main portion 71A, 72A may be provided.

Figure 12:
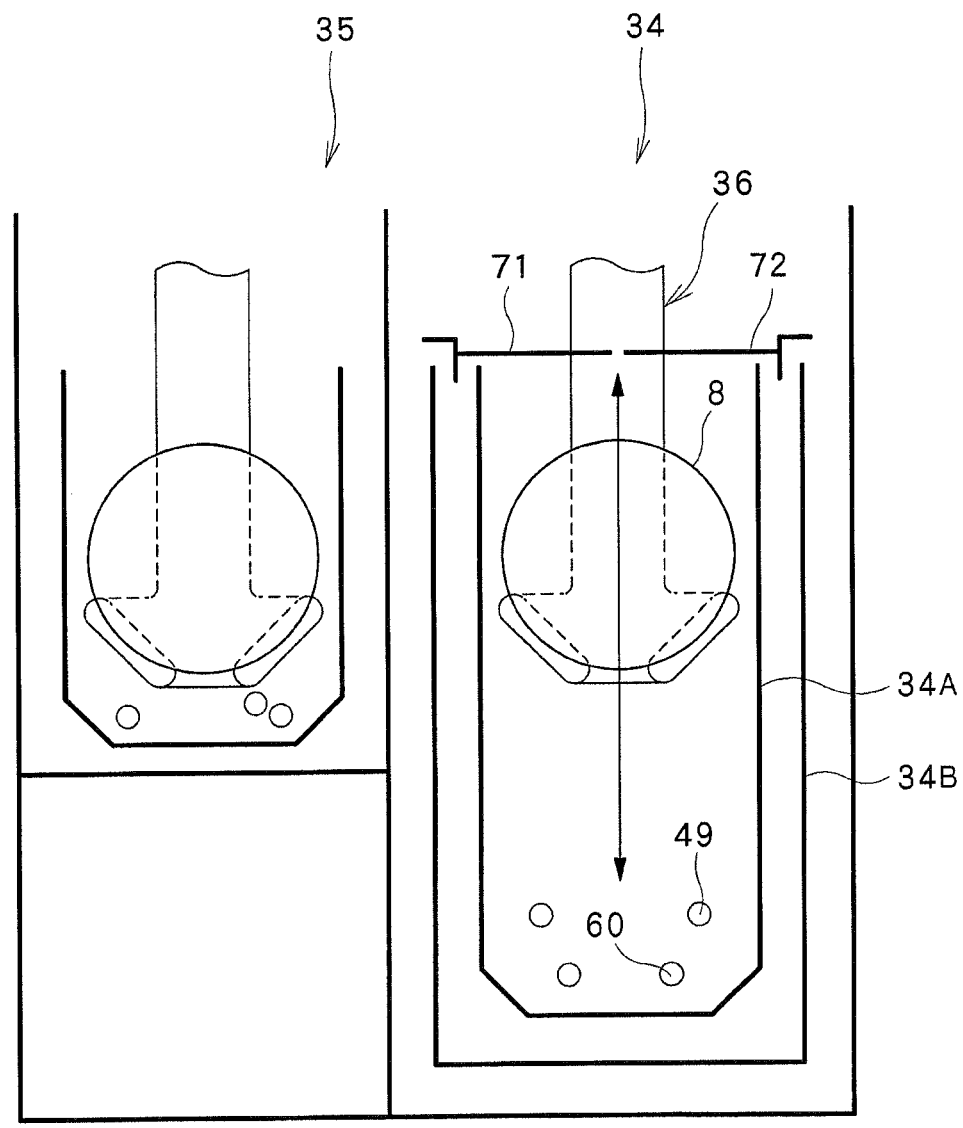
FIG. 12 is a schematic transverse vertical cross sectional view of a treatment tank in another modification.

Another embodiment is described with reference to FIG. 12. In the embodiment shown in FIG. 12, the depth of the treatment tank 34 (inner tank 34A) for etching is larger than the treatment tank 35 for rinsing. In a batch treatment, it is well known that substrates immersed in a treatment liquid are reciprocated up and down in order to promote flow of the treatment liquid in the gap between adjacent substrates 8 (this operation is referred to as "agitation"). A relative flow velocity of the treatment liquid (which is a flow velocity of the treatment liquid relative to the the substrates 8) and a moving time (which is a time from a movement start to a movement end of one way) are parameters that define the agitation conditions. By making deeper the inner tank 34A, values of these parameters can be increased so as to improve agitation efficiency. The depth of the inner tank 34A can be determined depending on the desired value of the relative flow velocity and the moving time.

In the above embodiments, the inner tank 34A is accommodated in the outer tank 34B, but is not limited thereto. The outer tank 34B may surround only the upper part of the inner tank, as is common in known treatment tanks. Also in this case, the splash of the treatment liquid can be prevented from reaching outside the outer tank 34B by providing the lid (71, 72) with the splash shielding portions (71B, 71D, 72B, 72D).

In the above embodiments, when the first lid 71 and the second lid 72 are in the close position, the lower ends of the splash shielding portions 71B, 71D, 72B and 72D are positioned at the horizontal positions outside the inner tank 34A and inside the outer tank 34B, whereby the splash of the treatment liquid (phosphoric acid aqueous solution) hitting onto the splash shielding portions 71B, 71D, 72B and 72D falls down into the outer tank 34B so as to be retained in the circulation system. However, in a case where it is not necessary to retain, in the circulation system, the treatment liquid component contained in the splash, the lower ends of the splash shielding portions 71B, 71D, 72B and 72D may be positioned at horizontal positions outside the outer tank 34B, e.g., outside the outer tank 34B and inside the liquid receiving container 80. That is, the splash shielding portions 71B, 71D, 72B and 72D may be ones that have at least a function of preventing the splash of the treatment liquid scattering from the surface of the treatment liquid in the inner tank 34A from reaching an unexpected area outside the inner tank 34A.

Figure 14:
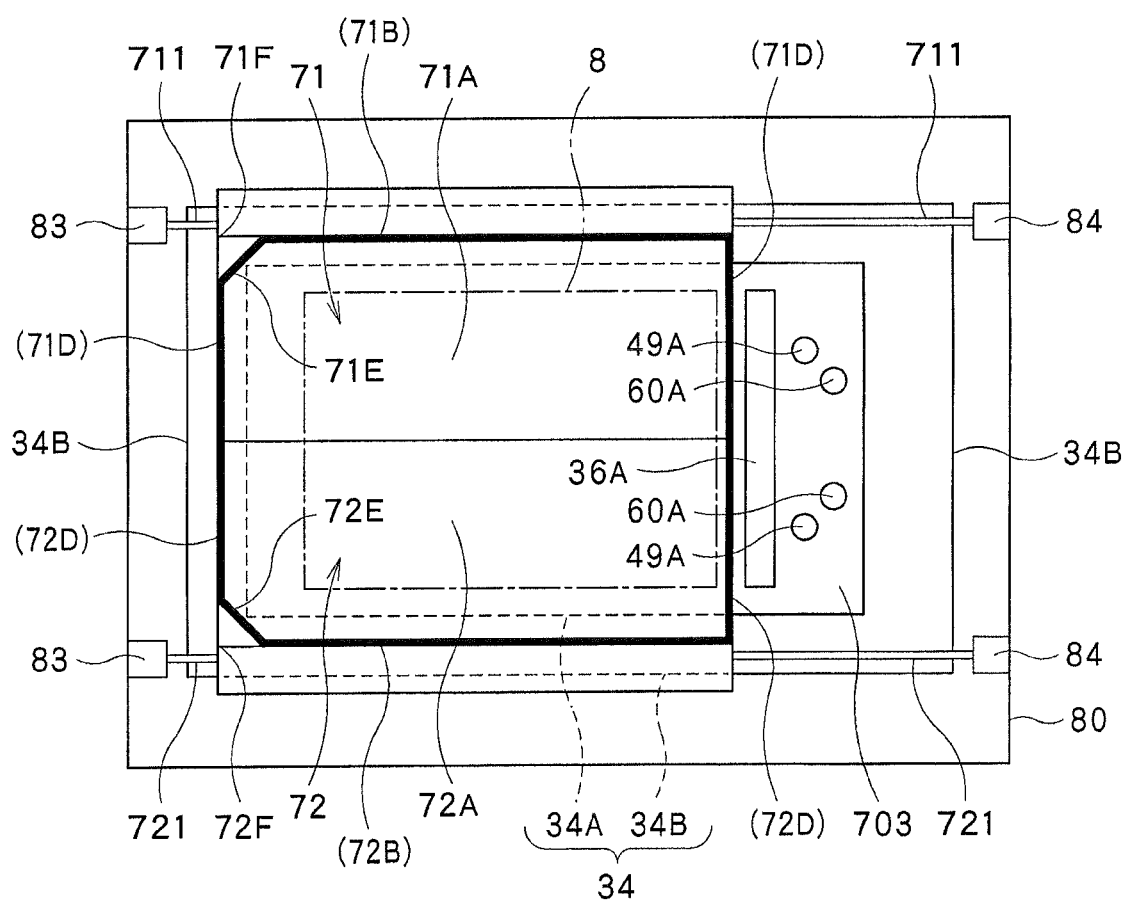
FIG. 14 is a schematic plan view of a treatment tank in still yet another modification.

Another embodiment is described with reference to FIG. 14, in comparison with the embodiment of FIG. 8. In FIG. 14, the first lid 71 and the second lid 72 extend in areas on the substrate 8 side (i.e., substrate support member 36B side) of the support plate 36A. Such a configuration invites no problem, because the overflow of the treatment liquid from the inner tank 34A to the outer tank 34B is mainly generated in areas on the substrate 8 side.

In the embodiment of FIG. 14, the lower surfaces of the main portion 71A of the first lid 71 and the main portion 72A of the second lid 72 are inclined such that the height of those lower surfaces lowers as going in the X negative direction. The lower surface of the main portion 71A of the first lid 71 is inclined such that the height of the lower surface lowers as going in the Y negative direction. The lower surface of the main portion 72A of the first lid 72 is inclined such that the height of that lower surface lowers as going in the Y positive direction.

In FIG. 14, the positions at which the aforementioned splash shielding portions (71B, 71D, 72B, 72D) are present are shown by the bold lines. The embodiment of FIG. 14 has a structure in which the first side portion (71B, 72B) is connected to the second side portion (71D, 72D) through an oblique side portion (71E, 72E) (which is also a part of the splash shielding portion) which extends at an angle with respect to the first side portion (71B, 72B) and the second side portion (71D, 72D). The above configuration is different from the configuration shown in FIG. 8 in which a first side portion (71B, 72B), which is a portion extending in the X direction of the splash shielding portions, and a second side portion (71D, 72D), which is a portion extending in the Y direction of the splash shielding portions, are directly connected at right angles to each other.

As described above, since the lower surfaces of the main portions 71A and 72A are inclined, the treatment liquid flows toward the oblique side portions 71E and 72E without remaining on the lower surfaces of the main portions 71A and 72A, and then falls down into the outer tank 34B below the oblique side portions 71E and 72E. Thus, falling of a large amount of the treatment liquid downward from the first lid 71 and the second lid 72 can be avoided when the first lid 71 and the second lid 72 are moved from the close position to the open position.

If the oblique side portions 71E and 72E are not present, when a large amount of the treatment liquid locally flows into a connection (indicated by the reference numeral 71F, 72F) between the light shielding portion (71B, 72B) extending in the X direction and the light shielding portion (71D, 72D), the treatment liquid may vigorously jumping out from the connection. In this case, since the distance between the connection (71F, 72F) and the sidewall of the outer tank 34B is small, the treatment liquid may jump outside the outer tank 34B.

On the other hand, since the oblique side portion 71E, 72E has a certain width, the liquid flowing into the inclined part 71E, 72E spreads along the length of the oblique side portion 71E, 72E. Thus, the liquid having flown into the oblique side portion 71E, 72E cannot jump out therefrom. In addition, even if the treatment liquid jumps out, the treatment liquid is not likely to jump outside the outer tank 34B, because the distance between the oblique side portion 71E, 72E and the sidewall of the outer tank 34B is relatively large.

A yet another embodiment is described with reference to FIGS. 15 and 16. In the embodiment shown in FIGS. 15 and 16, a wall portion 713 extending in the up and down direction is formed on a distal end portion of the main portion 71A of the first lid 71, and a wall portion 72J extending in the up and down direction is formed on a distal end portion of the main portion 72A of the second lid 72. When the first lid 71 and the second lid 72 are in the close position, a gap G having a height H is formed between the wall portions 71J and the wall portion 72J which are opposed to each other. Recesses 71R and 72R are formed in the upper surfaces of the main portion 71A and the main portion 72A, and as a result, the main portions 71A and 72A have substantially a box shape. Due to the provision of the recesses 71R and 72R, increase in weights of the first lid 71 and the second lid 72, which may be caused by the provision of the gap having the height H, can be reduced.

In the case where the lower surface of the main portion 71A of the first lid 71 in the close position and the lower surface of the main portion 72A of the second lid 72 in the close position are in contact with the liquid surface of the treatment liquid in the inner tank 34A as shown in FIG. 7, or in the case where the distal end portions of the main portion 71A and the main portion 72A are immersed in the treatment liquid in the inner tank 34A as shown in FIGS. 8 and 13, there is a possibility that the boiling treatment liquid springs upward from the gap G between the wall portion 71J and the wall portion 723 to scatter therearound. However, since the gap G having the height H is provided as described above, the boiling treatment liquid is unlikely to spring outside from the gap G. In order to achieve this effect, the height H may be not less than 5 cm, for example.

Figure 15:
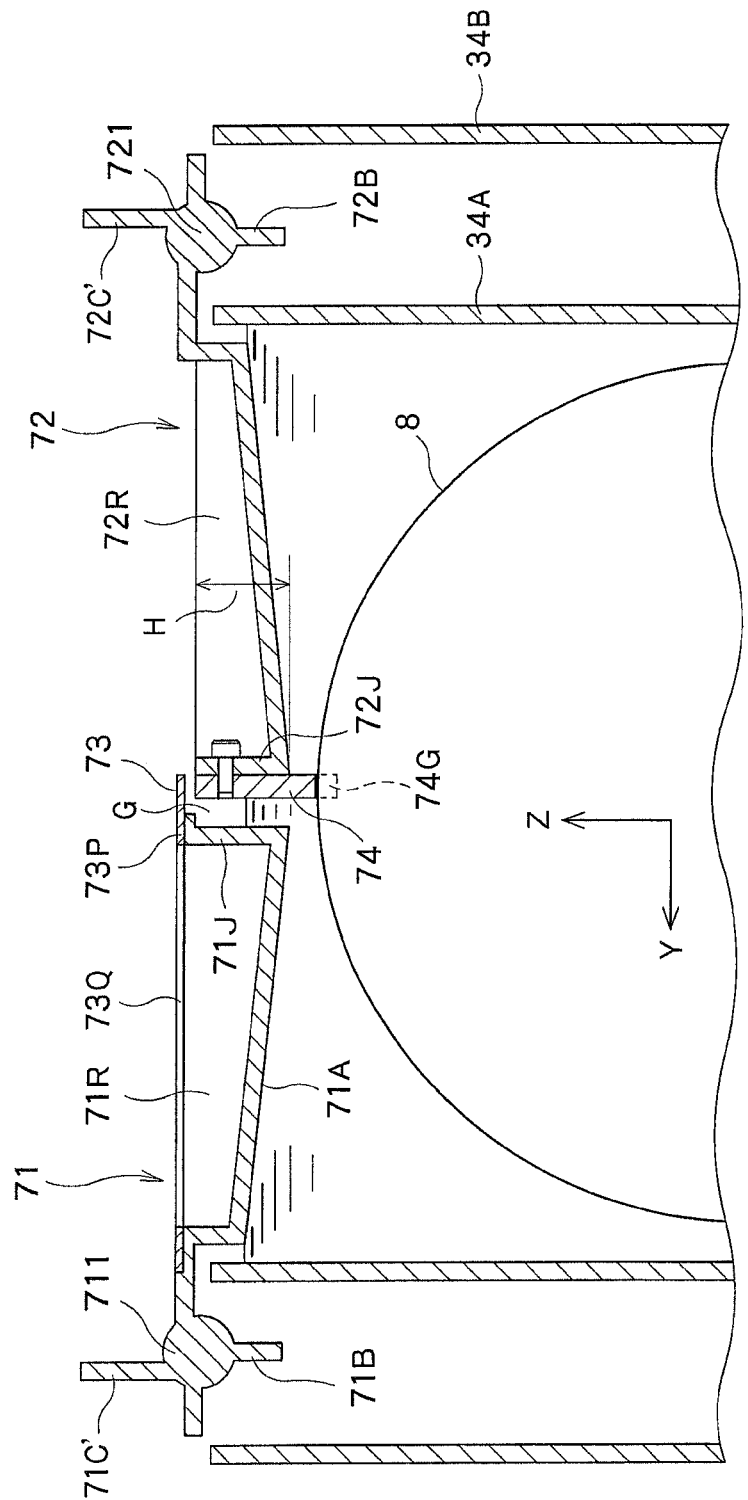
FIG. 15 is a schematic transverse vertical cross sectional view of an upper part of a treatment tank having a lid in another embodiment.
Figure 16:
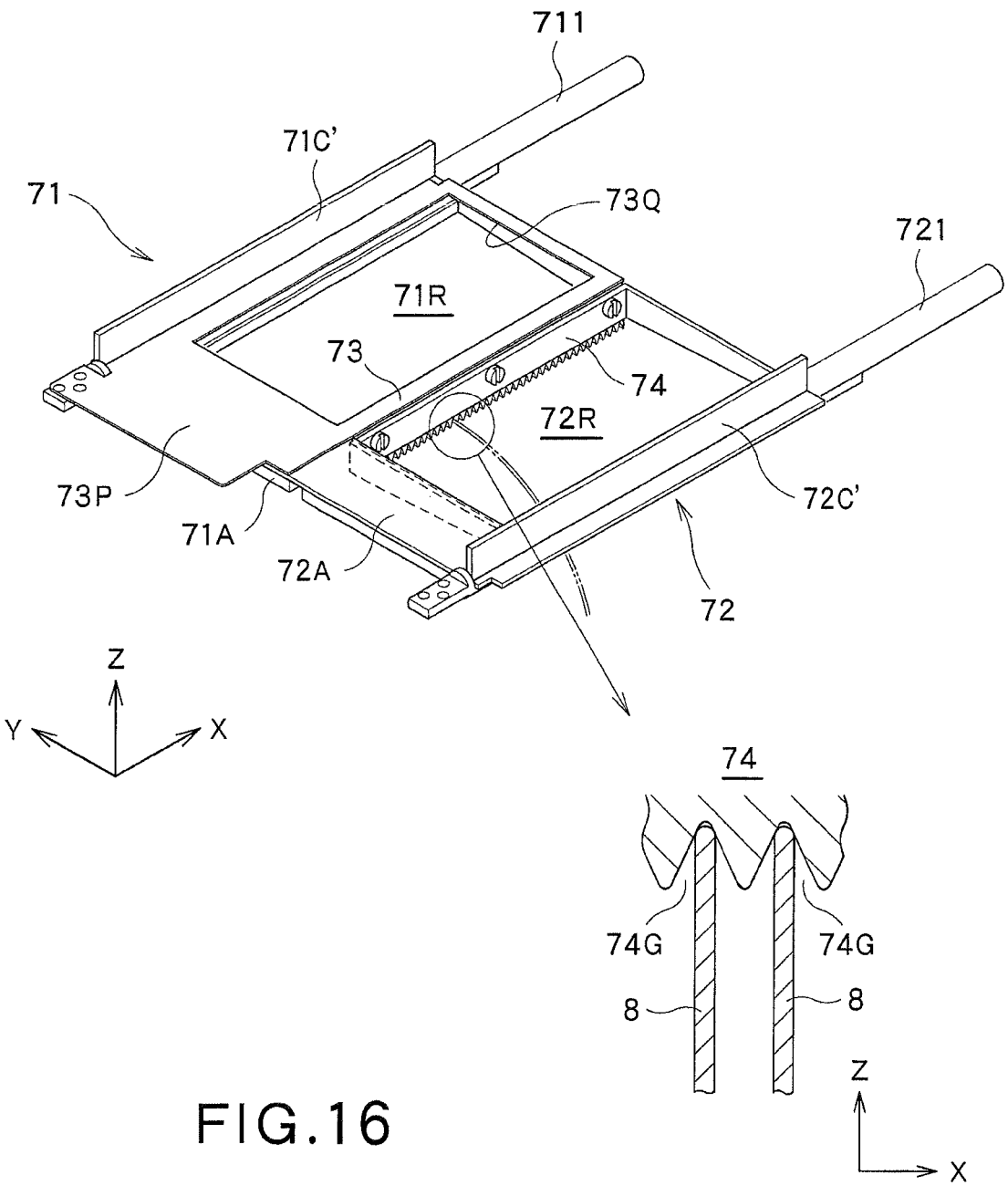
FIG. 16 is a perspective view (including a partial enlarged cross sectional view) of the lid of FIG. 15.

As shown in FIGS. 15 and 16, it is preferable that any one (here main portion 71A) of the main portion 71A of the first lid 71 and the main portion 72A of the second lid 72 is provided with a cover 73 that extends up to or beyond a position above the distal end of the other (here main portion 72A) so as to cover the gap G from above. As shown in FIGS. 15 and 16, the cover 73 may be provided by mounting a cover plate 73P, which has a substantially rectangular cutout 73Q corresponding to the contour of the recess 71R of the first lid 71, on the upper surface of the main portion 71A of the first lid 71. By providing the cover 73, the treatment liquid can be prevented from springing upward from the gap G.

Since the gap G has the height H, the force of droplets of the treatment liquid scattering from the liquid surface of the treatment liquid in the inner tank 34A weakens before the droplets hit the cover 73. Thus, the treatment liquid hitting on the cover 73 cannot spring out laterally.

The cover 73 may be formed integrally with the first lid 71. Alternatively, the cover 73 may be omitted. If the cover 73 is not provided, the height H is preferably higher than the height H if the cover 73 is provided.

In addition, as shown in FIGS. 15 and 16, it is preferable to provide a substrate holding member 74 on any one of the main portion 71A of the first lid 71 and the main portion 72A of the second lid 72 (in the illustrated embodiment, the distal end portion of the main portion 72A of the second lid 72). A lower surface of the substrate holding member 74 has a plurality of substrate holding grooves 74G arrayed in the direction (X direction) in which the substrates 8 are arrayed, wherein the substrate holding grooves 74G are located at X direction positions as those of the the substrate support grooves (not shown) of the substrate support member 36B, and wherein the substrate holding grooves 74G are arrayed at the same pitch as that of the substrate support grooves (not shown). The circumferential edge of one substrate 8 is accommodated in each substrate holding groove 74G. In the embodiment shown in FIGS. 15 and 16, the substrate holding member 74 is an elongated plate-like member formed separately from the second lid 72, and is screwed onto the main portion 72A of the second lid 72. The substrate holding member 74 may be integrally formed with the second lid 72.

During the treatment of the substrates 8, the substrate holding member 74 disposed on the second lid 72 in the close position engages with the substrates 8 supported by the substrate support member 36B so as to prevent or suppress upward displacement of the substrates 8. Thus, even when the treatment liquid is discharged from the treatment liquid supplying nozzles 49 at a large flow rate, or even when the boiling level of the treatment liquid in the inner tank 34A becomes higher, or even when the nitrogen gas bubbling is intensively performed, the substrates 8 cannot be removed from the substrate support member 36B.

Figure 17:
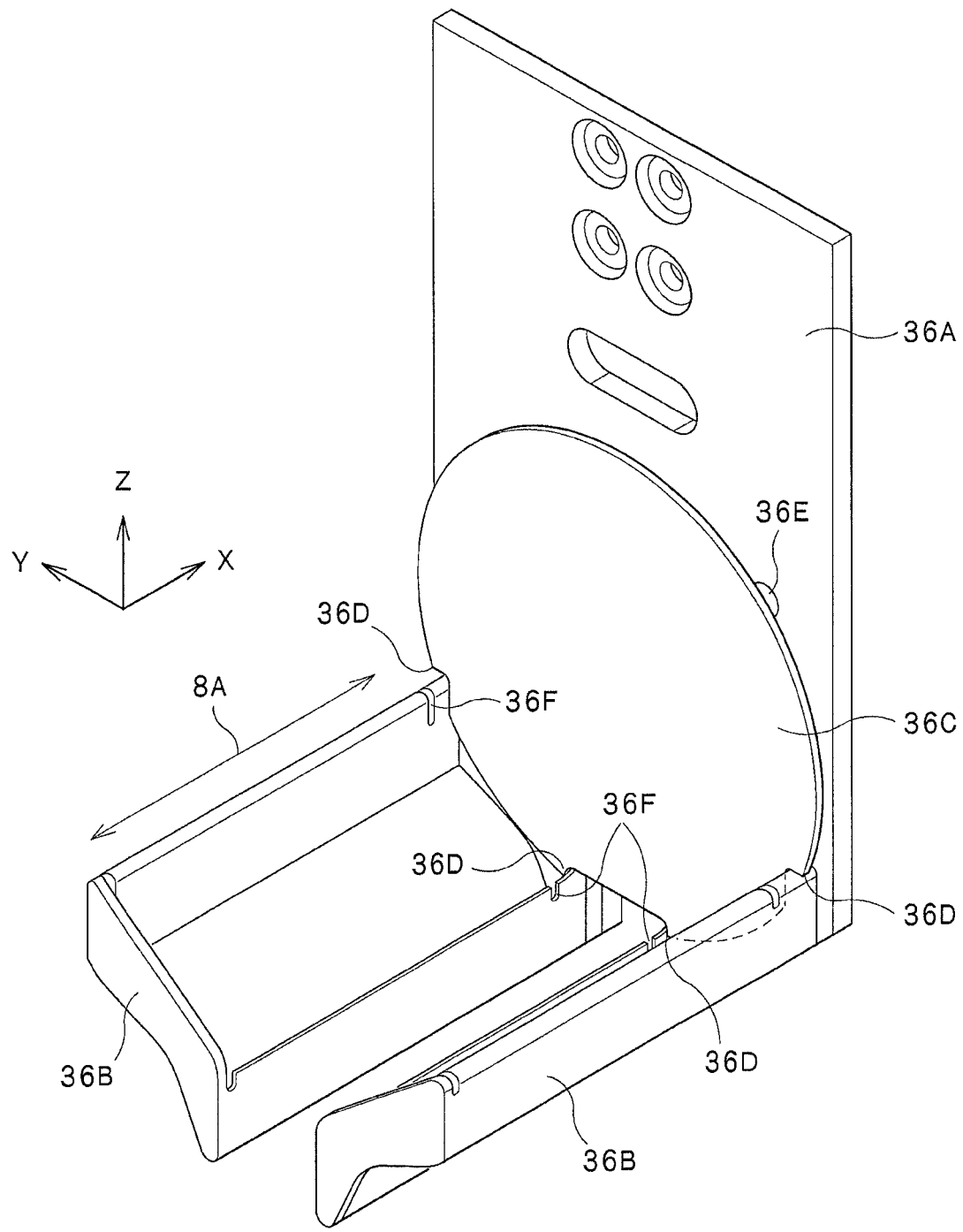
FIG. 17 is a perspective view of a substrate lifting mechanism in another embodiment.

Next, as a further another embodiment, improvement in the support plate 36A and the substrate support member 36B of the substrate lifting mechanism 36 is described with reference to FIG. 17. The substrate support member 36B has a plurality of substrate holding grooves 36F (only one is shown in FIG. 17) arrayed in the X direction at regular intervals. A plurality of (e.g., fifty) substrates 8 are supported by the substrate support member 36B so as to be arrayed side by side at regular intervals in the X direction, in such a manner that the respective circumferential edges of the substrates 8 are inserted in the substrate holding grooves 36F.

When the batch treatment is performed, the substrates 8 (semiconductor wafers) are arranged such that their patterned surfaces (i.e., the surface having a device pattern) are all directed in the same direction (referred to as "FACE TO BACK" or "BACK TO FACE"), or arranged such that twenty five pairs of adjacent wafers W whose patterned surfaces (or non-patterned surfaces) are opposed to each other are arrayed (referred to as "FACE TO FACE" or "BACK TO BACK").

As can be understood from FIG. 5, in a case where the substrate lifting mechanism 36 of a common structure is employed, one surface (referred to as "surface A" herebelow), on the side of the support plate 36A, of the substrate 8 nearest to the support plate 36A faces the support plate 36A, while the other surface not facing the support plate 36A faces an adjacent substrate 8. One surface, on the side of the support plate 36A, of the substrate 8 farthest from the support plate 36A faces an adjacent substrate 8, while the other surface (referred to as "surface B" herebelow) farther from the support plate 36A faces nothing. Flow conditions of the treatment liquid near the surface A and the surface B are significantly different from those of the other surfaces of the substrates 8.

Thus, in order to improve the treatment uniformity of the pattern formed surfaces of the plurality of (e.g., fifty) substrates 8, the FACE TO FACE arrangement is generally employed such that the surface A and the surface B are not patterned surfaces.

However, in a case where a multilayer lamination structure such as a 3D-NAND is formed on a patterned surface, the substrate 8 has an ineligible warp. Thus, it is impossible to employ the FACE TO FACE (also BACK TO BACK) arrangement, or there are a lot of problems even if it were possible. Thus, the FACE TO BACK arrangement or BACK TO FACE arrangement is preferably employed.

Under the aforementioned circumstances, in the embodiment shown in FIG. 17, a discoid rectifying plate 36C having the same diameter as that of the substrate 8 to be treated is disposed on the substrate lifting mechanism 36. Lower parts of the rectifying plate 36C are fixed on the substrate support members 36B by fixing parts 36D. Further, one surface of the rectifying plate 36C facing the support plate 36A is fixed to the support plate 36C by fixing parts 36E (only one is shown in FIG. 17). When a predetermined number of (e.g., fifty) substrates 8 are placed on the substrate support member 36B, the rectifying plate 36C is positioned such that the arrangement pitch in the X direction of the substrates 8 and the distance in the X direction between the rectifying plate 36C and the substrate 8 adjacent to the rectifying plate 36C are the same and such that the predetermined number of substrates 8 and the rectifying plate 36C are linearly arrayed side by side in the X direction.

By placing the substrates 8 on the substrate support member 36B such that the front surfaces (patterned surfaces having devices) of the substrates 8 are all directed toward the support plate 36A, the front surface of the substrate, which is nearest to the support plate 36A, faces the rectifying plate 36C, and the front surfaces of all the other substrates 8 each face the rear surface (non-patterned surface without devices) of the adjacent substrate. That is, the front surfaces of all the substrates 8 face any object having the same shape as that of the substrate 8, and the distance in the X direction between the front surface of each substrate 8 to the object adjacent thereto are the same, for all the substrates 8. Thus, flows of the treatment liquid near the front surfaces of all the substrates 8 are made uniform, whereby the surface treatment conditions of all the substrates 8 are made uniform.

Although the rectifying plate 36C preferably has completely the same shape as that of the substrate 8, it is sufficient that the rectifying plate 36C has the same planar shape as seen from the X direction. Thus, the rectifying plate 36C may have a somewhat different thickness, for example. In addition, although the above rectifying plate 36C is fixed on the substrate support member 36B on the side of the support plate 36A, the rectifying plate 36C is fixed on the end of the substrate support member 36B on the X negative side. In this case, the substrates 8 are placed on the substrate support member 36B such that the front surfaces of all the substrates 8 are directed toward the rectifying plate 36C.

The above-described various embodiments and modified examples may be optionally combined, unless the combination apparently produces a problem.

In the above embodiments, the treatment liquid is a phosphoric acid aqueous solution, but is not limited thereto. Any treatment liquid, which is used under conditions that splash is generated from the liquid surface, may be used. Substrates are not limited to semiconductor wafers, and may be substrates made of another material such as glass, ceramics, etc.

What is claimed is:
1. A substrate liquid treatment apparatus comprising:
an inner tank configured to store a treatment liquid and having an upper opening;
an outer tank disposed outside the inner tank; and
a lid movable between a close position for closing the upper opening of the inner tank and an open position for opening the upper opening of the inner tank,
wherein the lid includes:
a main portion that covers the upper opening of the inner tank when the lid is positioned at the close position; and a splash shielding portion connected to the main portion so as to move integrally with the main portion, wherein when the lid is positioned at the close position, the splash shielding portion extends from a position higher than an upper end of a side wall of the inner tank adjacent to the splash shielding portion to a position which is lower than the upper end of the side wall and which is on the outer tank side of the side wall, the lid includes a first lid part that covers a first part of the upper opening of the inner tank and a second lid part that covers a second part of the upper opening of the inner tank, the first lid part and the second lid part are rotatable about respective rotation axes extending horizontally to move between the close position and the open position, and the first lid part and the second lid part each have the main portion and the splash shielding portion, and the lid includes a guide portion that is angled with respect to the splash shielding portion, the guide portion having a free end which is located outside of the outer tank when the lid is positioned at the open position, the guide portion is connected to the main portion such that the guide portion guides a liquid, which adheres to an upper surface of the main portion when the first lid part is in the close position, to a location outside of the outer tank by allowing the liquid to leave the guide portion from the free end, which becomes a lowermost end of the guide portion, when the first lid part is place in the open position.

2. The substrate liquid treatment apparatus according to claim 1, wherein the outer tank is configured to receive the treatment liquid overflowing from the inner tank.

3. The substrate liquid treatment apparatus according to claim 2, wherein when the lid is positioned in the close position, a lower end of the splash shielding portion is positioned at a horizontal position outside the inner tank and inside the outer tank.

4. The substrate liquid treatment apparatus according to claim 1, wherein when the first lid part and the second lid part are in the close position, the whole of the main portions of the first lid part and the second lid part is positioned at a level which is substantially the same as a height of a surface of the treatment liquid in the inner tank when the treatment liquid is overflowing from the inner tank to the outer tank.

5. The substrate liquid treatment apparatus according to claim 1, wherein when the first lid part and the second lid part are in the close position, the main portions of the first lid part and the second lid part are inclined such that, when the treatment liquid is overflowing from the inner tank to the outer tank, proximal end portions of the main portions of the first lid part and the second lid part are positioned higher than the surface of the treatment liquid in the inner tank, while distal end portions of the main portions of the first lid part and the second lid part are positioned lower than the surface of the treatment liquid in the inner tank.

6. The substrate liquid treatment apparatus according to claim 5, wherein when the first lid part and the second lid part are in the close position, the distal end portion of the main portion of the first lid part and the distal end portion of the main portion of the second lid part overlap each other in a plan view.

7. The substrate liquid treatment apparatus according to claim 6, wherein when the first lid part and the second lid part are in the close position, the distal end portion of the main portion of the first lid part and the distal end portion of the main portion of the second lid part are spaced apart from each other.

8. The substrate liquid treatment apparatus according to claim 5, further comprising a first auxiliary lid and a second auxiliary lid disposed above the first lid part and the second lid part, respectively.

9. The substrate liquid treatment apparatus according to claim 1, wherein the splash shielding portion of each of the first lid part and the second lid part has a first side portion extending in a direction of the rotation axis, and a second side portion extending in a direction perpendicular to the rotation axis, and an oblique side portion extending at angles with respect to the first side portion and the second side portion to connect end portions of the first side portion and the second side portion with each other.

10. The substrate liquid treatment apparatus according to claim 9, wherein a lower surface of each of the first and second lid part is inclined such that the lower surface lowers as approaching the first side portion and lowers as approaching the second side portion.

11. The substrate liquid treatment apparatus according to claim 1, further comprising a substrate support member configured to support a plurality of substrates from below in the inner tank, and a substrate holding member provided on at least one of the first lid part and the second lid part, wherein the substrate holding member is configured to engage with the substrates supported by the substrate support member to prevent or suppress displacement of the substrates at least in an upward direction when the first lid part and the second lid part are in the close position.

* * * * *